United States Patent
Nakamura

(10) Patent No.: US 7,609,299 B2
(45) Date of Patent: *Oct. 27, 2009

(54) SOLID-STATE IMAGE SENSING APPARATUS

(75) Inventor: Satoshi Nakamura, Ikeda (JP)

(73) Assignee: Minolta Co., Ltd., Osaka (JP)

( * ) Notice: Subject to any disclaimer, the term of this patent is extended or adjusted under 35 U.S.C. 154(b) by 445 days.

This patent is subject to a terminal disclaimer.

(21) Appl. No.: 11/411,138

(22) Filed: Apr. 26, 2006

(65) Prior Publication Data

US 2006/0192877 A1 Aug. 31, 2006

Related U.S. Application Data

(62) Division of application No. 09/903,521, filed on Jul. 13, 2001, now Pat. No. 7,061,529.

(30) Foreign Application Priority Data

Jul. 19, 2000 (JP) ............... 2000-218634

(51) Int. Cl.
H04N 5/228 (2006.01)
H04N 9/73 (2006.01)
H04N 5/208 (2006.01)
H04N 1/40 (2006.01)
G06K 9/00 (2006.01)

(52) U.S. Cl. ............... 348/222.1; 348/223.1; 348/252; 358/448; 382/167

(58) Field of Classification Search ............. 348/222.1, 348/223.1
See application file for complete search history.

(56) References Cited

U.S. PATENT DOCUMENTS

| 4,962,419 | A | | 10/1990 | Hibbard et al. | |
| 5,008,739 | A | * | 4/1991 | D'Luna et al. | 348/254 |
| 5,241,575 | A | * | 8/1993 | Miyatake et al. | 257/234 |
| 5,289,286 | A | * | 2/1994 | Nakamura et al. | 348/223.1 |
| 5,438,360 | A | * | 8/1995 | Edwards | 348/208.1 |
| 5,861,621 | A | * | 1/1999 | Takebe et al. | 348/297 |
| 6,545,710 | B1 | * | 4/2003 | Kubo et al. | 348/223.1 |
| 6,683,645 | B1 | * | 1/2004 | Collins et al. | 348/294 |
| 6,967,682 | B1 | | 11/2005 | Hagihara | |
| 2003/0058355 | A1 | * | 3/2003 | Wong et al. | 348/231.99 |
| 2003/0164884 | A1 | * | 9/2003 | Morris et al. | 348/222.1 |

* cited by examiner

*Primary Examiner*—Nhan T Tran
(74) *Attorney, Agent, or Firm*—Morrison & Foerster LLP

(57) ABSTRACT

A solid-state image sensing apparatus in which a first signal converted linearly to the intensity of incident light, and a second signal converted logarithmically to the intensity of light, can be processed by a common circuit after undergoing a predetermined signal processing.

9 Claims, 11 Drawing Sheets

SOLID-STATE IMAGE SENSING APPARATUS

CLAIM FOR PRIORITY

This application is a divisional application of U.S. patent application Ser. No. 09/903,521, filed on Jul. 13, 2001, now U.S. Pat. No. 7,061,529, which is based on Japanese patent application No. 2000-218634, filed in Japan on Jul. 19, 2000, the entire contents of which are hereby incorporated by reference.

TECHNICAL FIELD OF THE INVENTION

The present invention relates to a solid-state image sensing apparatus, and in particular, to a solid state image sensing apparatus having a solid-state image sensing device switchable between a first and second operating mode.

BACKGROUND OF THE INVENTION

Conventionally used solid-state image sensing devices are broadly divided into a CCD type and a MOS type, depending on the means for reading an optical charge generated at a photoelectrically converting element. The CCD type transfers the optical charge while accumulating it in a well of a potential, whereas the MOS type reads, through MOS transistors, the charge stored in a p-n junction capacitance of a photodiode. However, since an output proportional to the amount of the generated optical charge is produced, the dynamic ranges of these conventional solid-state image sensing devices are narrow.

U.S. Pat. No. 5,241,575 to Minolta discloses a solid-state image sensing device capable of outputting electric signals converted natural-logarithmically to the intensity of the incident light by providing (to increase the dynamic range), photosensitive means capable of generating photoelectric current proportional to the intensity of the incident light, a MOS transistor supplied with the photoelectric current, and bias means for biasing the MOS transistor so that a subthreshold current can flow therethrough. This solid-state image sensing apparatus has insufficient low-light condition and SN ratio characteristics, despite having a wide dynamic range.

SUMMARY OF THE INVENTION

In one embodiment of the invention, there is a solid-state image sensing apparatus. The apparatus includes a solid-state image sensing device outputting an electrical signal proportional to an intensity of incident light, the solid-state image sensing device configured for outputting a first signal converted linearly to the intensity of the incident light and a second signal converted natural-logarithmically to the intensity of the incident light; a first signal processing circuit supplied with the first signal from the solid-state image sensing apparatus and performing a predetermined signal processing; and a second signal processing circuit supplied with the second signal from the solid-state image sensing apparatus and performing a predetermined signal processing.

In another embodiment of the invention, there is an apparatus including a solid-state image sensing device that outputs an electrical signal proportional to an intensity of incident light, the solid-state image sensing device configured for outputting a first signal converted linearly to the intensity of the incident light and a second signal converted natural-logarithmically to the intensity of the incident light, comprising: a first signal processing circuit supplied with the first signal from the solid-state image sensing apparatus and performing a predetermined signal processing; a second signal processing circuit supplied with the second signal from the solid-state image sensing apparatus and performing a predetermined signal processing; a logarithmic/linear conversion circuit converting a signal output from the second signal processing circuit to a signal linearly proportional to the intensity of the incident light; and a third signal processing circuit supplied with a signal from the first signal processing circuit and a signal from the logarithmic/linear conversion circuit.

In one aspect of the invention, there is a plurality of color filters are provided in the solid-state image sensing device, and the first signal and the second signal output from the solid-state image sensing apparatus each comprise a plurality of color signals, the first signal processing circuit performs white balance adjustment of the first signal, and the second signal processing circuit performs white balance adjustment of the second signal.

In another aspect of the invention, the first signal processing circuit performs gamma correction of the first signal, and the second signal processing circuit performs gamma correction of the second signal.

In still another aspect of the invention, a dynamic range of the second signal is adjusted at the second signal processing circuit.

In another embodiment of the invention, there is a solid-state image sensing apparatus, comprising: a solid-state image sensing device outputting an electrical signal proportional to an intensity of incident light, the solid-state image sensing device configured for outputting a first signal converted linearly to the intensity of the incident light and a second signal converted natural-logarithmically to the intensity of the incident light; a logarithmic/linear conversion circuit converting the second signal to a signal linearly proportional to the intensity of the incident light; and a signal processing circuit supplied with the first signal and a signal from the logarithmic/linear conversion circuit.

In one aspect of the invention, there is a plurality of color filters are provided in the solid-state image sensing device, and the first signal and the second signal output from the solid-state image sensing apparatus each comprise a plurality of color signals, and the signal processing circuit performs white balance adjustment of the supplied signals.

In another aspect of the invention, the signal processing circuit performs gamma correction of the supplied signals.

In yet another embodiment of the invention, there is a solid-state image sensing apparatus having a solid-state image sensing device that outputs an electrical signal proportional to an intensity of incident light, the solid-state image sensing device configured for outputting a first signal converted linearly to the intensity of the incident light and a second signal converted natural-logarithmically to the intensity of the incident light, comprising: a first signal processing circuit supplied with the second signal from the solid-state image sensing apparatus and performing a predetermined signal processing; a linear/logarithmic conversion circuit converting the first signal to a signal natural-logarithmically proportional to the intensity of the incident light; and a second signal processing circuit supplied with a signal from the first signal processing circuit and a signal from the linear/logarithmic conversion circuit.

In one aspect of the invention, there is a plurality of color filters are provided in the solid-state image sensing device, and the first signal and the second signal output from the solid-state image sensing apparatus each comprise a plurality of color signals, and the second signal processing circuit performs white balance adjustment of the supplied signals.

In another aspect of the invention, the second signal processing circuit performs gamma correction of the supplied signals.

In still another aspect of the invention, there is a dynamic range of the second signal is adjusted at the first signal processing circuit.

In yet another embodiment of the invention, there is a solid-state image sensing apparatus, comprising: a solid-state image sensing device outputting an electrical signal proportional to an intensity of incident light, the solid-state image sensing device configured for outputting a first signal converted linearly to the intensity of the incident light and a second signal converted natural-logarithmically to the intensity of the incident light, a linear/logarithmic conversion circuit converting the first signal to a signal natural-logarithmically proportional to the intensity of the incident light; and a signal processing circuit supplied with the second signal and a signal from the linear/logarithmic conversion circuit.

In still another embodiment of the invention, there is a solid-state image sensing apparatus having a solid-state image sensing device that outputs an electrical signal proportional to an intensity of incident light, the solid-state image sensing device configured outputting a first signal converted linearly to the intensity of the incident light and a second signal converted natural-logarithmically to the intensity of the incident light, comprising: a first signal processing circuit supplied with the first signal from the solid-state image sensing apparatus and performing a predetermined signal processing; a second signal processing circuit supplied with the second signal from the solid-state image sensing apparatus and performing a predetermined signal processing; a linear/logarithmic conversion circuit converting a signal output from the first signal processing circuit to a signal natural-logarithmically proportional to the intensity of the incident light; and a third signal processing circuit supplied with a signal from the second signal processing circuit and a signal from the linear/logarithmic conversion circuit.

In one aspect of the invention, there is a plurality of color filters are provided in the solid-state image sensing device, and the first signal and the second signal output from the solid-state image sensing apparatus each comprise a plurality of color signals, the first signal processing circuit performs white balance adjustment of the first signal, and the second signal processing circuit performs white balance adjustment of the second signal.

In one aspect of the invention, the first signal processing circuit performs gamma correction of the first signal, and the second signal processing circuit performs gamma correction of the second signal.

In another aspect of the invention, there is a dynamic range of the second signal is adjusted at the second signal processing circuit.

In still another embodiment of the invention, there is a image sensing apparatus, comprising: a solid-state image sensing device controlled to perform linear and logarithmic conversion on a first signal and a second signal, respectively; and a signal processing circuit receiving the first and second signals, the first signal and the second signal processed with respective predetermined signal processing.

In one aspect of the invention, there is a first signal processing circuit receiving the first signal form the solid-state image sensing device and performing the respective predetermined signal processing; and a second signal processing circuit receiving the second signal from the solid-state image sensing device and performing the respective predetermined signal processing.

In another aspect of the invention, the first signal processing circuit performs the respective predetermined signal processing on a liner signal, and the second signal processing circuit performs the respective predetermined signal processing on a logarithmic signal.

In still another aspect of the invention, the first signal is a linearly converted signal and the second signal is a logarithmically converted signal.

DETAILED DESCRIPTION OF THE PREFERRED EMBODIMENTS OF THE INVENTION

Figure 1:
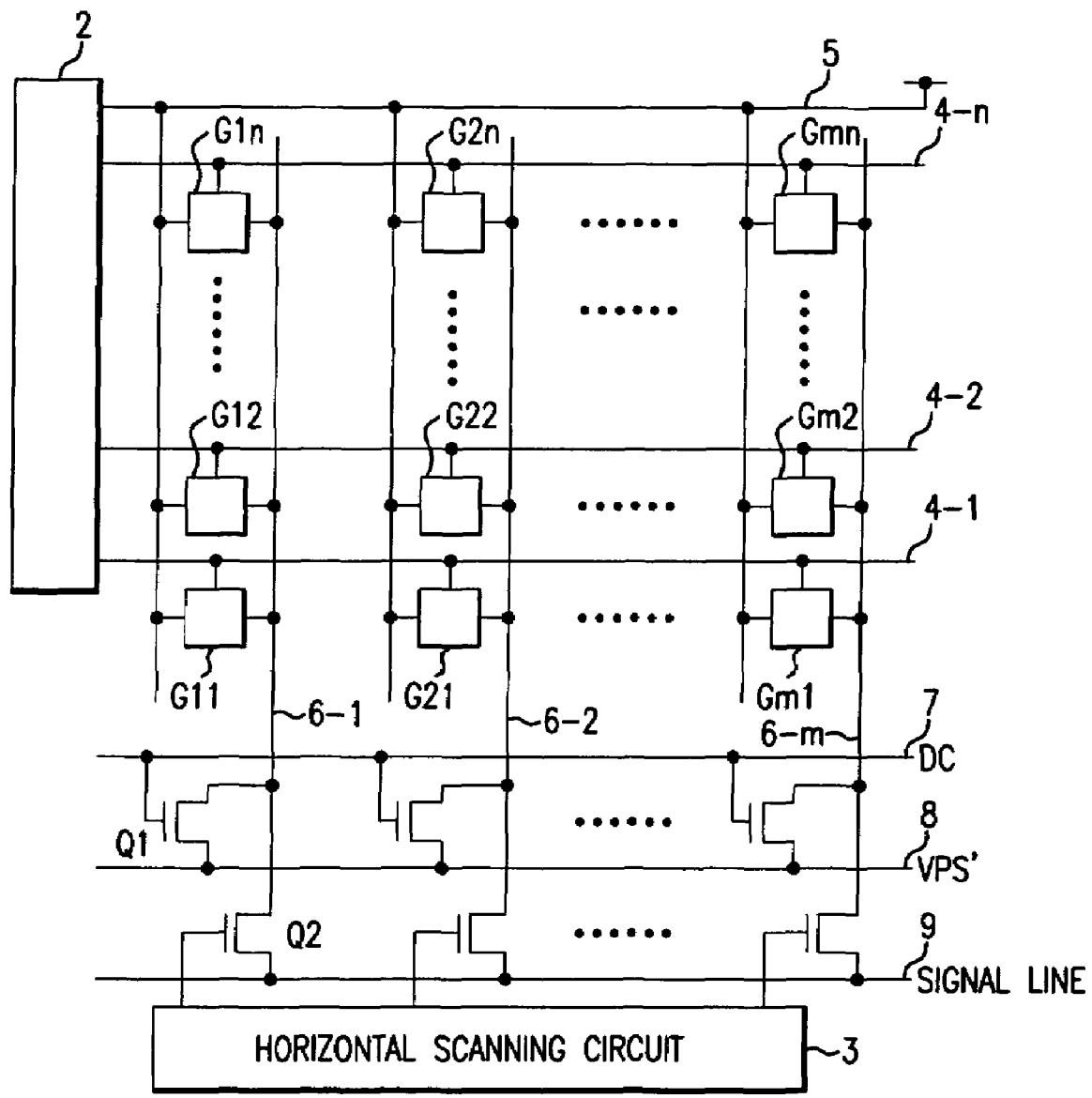
FIG. 1 is a block circuit diagram showing an example of the internal structure of the solid-state image sensing device of the present invention.

The present invention discloses a solid-state image sensing device that has photosensitive means capable of generating photoelectric current proportional to the intensity of the incident light and a MOS transistor supplied with the photoelectric current, and is switchable between a first condition producing an output converted linearly to the photoelectric current and a second condition producing an output converted natural-logarithmically to the photoelectric current by switching the bias voltage applied to the MOS transistor.

Presently, a succeeding signal processing circuit that performs gamma correction, matrix conversion, edge enhancement, color adjustment or the like on the output from the solid-state image sensing device, as described above, is typically used for processing an output converted linearly to the incident light. However, for a solid-state image sensing device switched between a condition producing a linearly converted output and a condition producing a natural-logarithmically converted output, it is necessary that the succeeding signal processing circuit handle both conditions. Therefore, as the succeeding signal processing circuit handling an output from such a solid-state image sensing device, it is necessary to provide two kinds of signal processing circuits, one handling a linearly converted output and the other handling a natural-logarithmically converted output. This increases the scale of the signal processing circuit.

The present invention provides a solid-state image sensing device in which a first signal converted linearly to the intensity of the incident light and a second signal converted natural-logarithmically to the intensity of the incident light can be processed by a common circuit after undergoing a predetermined signal processing.

The solid-state image sensing apparatus of the present invention includes, for example, a solid-state image sensing device that outputs an electric signal proportional to the intensity of the incident light, wherein the solid-state image sensing device is capable of outputting a first signal converted linearly to the intensity of the incident light and a second signal converted natural-logarithmically to the intensity of the incident light, and comprises: a first signal processing circuit that is supplied with the first signal from the solid-state image sensing apparatus and performs a predetermined signal processing; and a second signal processing circuit that is supplied with the second signal from the solid-state image sensing apparatus and performs a predetermined signal processing.

In this solid-state image sensing apparatus, when the first signal is output from the solid-state image sensing device, a predetermined signal processing (such as white balance adjustment or gamma correction) is performed on the signal at the first signal processing circuit. When the second signal is output from the solid-state image sensing device, a predetermined signal processing (such as white balance adjustment or gamma correction) is performed on the signal at the second signal processing.

Following is an example when a white balance adjustment is performed on the first and the second signals at the first and the second signal processing circuits, respectively. At the first signal processing circuit, the color signals constituting the first signal are multiplied by a predetermined value to perform the white balance adjustment. At the second signal processing circuit, a predetermined offset level is added to the color signals constituting the second signal to perform the white balance adjustment. As a second example, when gamma correction is performed on the first and the second signals at the first and the second signal processing circuits, respectively, the first signal is raised to the power of $\gamma$ to perform the gamma correction at the first signal processing circuit, and the second signal is multiplied by $\gamma$ to perform the gamma correction at the second signal processing circuit.

Another embodiment of the invention provides a solid-state image sensing apparatus having a solid-state image sensing device that outputs an electric signal proportional to the intensity of the incident light, wherein the solid-state image sensing device is capable of outputting a first signal converted linearly to the intensity of the incident light and a second signal converted natural-logarithmically to the intensity of the incident light, and comprises: a first signal processing circuit that is supplied with the first signal from the solid-state image sensing apparatus and performs a predetermined signal processing; a second signal processing circuit that is supplied with the second signal from the solid-state image sensing apparatus and performs a predetermined signal processing; a logarithmic/linear conversion circuit that converts a signal output from the second signal processing circuit to a signal linearly proportional to the intensity of the incident light; and a third signal processing circuit supplied with a signal from the first signal processing circuit and a signal from the logarithmic/linear conversion circuit.

In still another embodiment of the invention, a plurality of color filters may be provided in the solid-state image sensing device. The first signal and the second signal output from the solid-state image sensing apparatus may each comprise a plurality of color signals, the first signal processing circuit may perform white balance adjustment of the first signal, and the second signal processing circuit may perform white balance adjustment of the second signal.

At the first signal processing circuit, the color signals constituting the first signal are multiplied by a predetermined value to perform the white balance adjustment, and at the second signal processing circuit, a predetermined offset level is added to the color signals constituting the second signal to perform the white balance adjustment.

The first signal processing circuit may perform gamma correction of the first signal, and the second signal processing circuit may perform gamma correction of the second signal. The first signal is raised to the power of $\gamma$ to perform the gamma correction at the first signal processing circuit, and the second signal is multiplied by $\gamma$ to perform the gamma correction at the second signal processing circuit.

Additionally, the dynamic range of the second signal may be adjusted at the second signal processing circuit.

In yet another embodiment of the invention, a solid-state image sensing apparatus having a solid-state image sensing device that outputs an electric signal proportional to the intensity of the incident light, and characterized in that the solid-state image sensing device is capable of outputting a first signal converted linearly to the intensity of the incident light and a second signal converted natural-logarithmically to the intensity of the incident light, and comprises: a logarithmic/linear conversion circuit that converts the second signal to a signal linearly proportional to the intensity of the incident light; and a signal processing circuit supplied with the first signal and a signal from the logarithmic/linear conversion circuit.

In this solid-state image sensing apparatus, a plurality of color filters may be provided in the solid-state image sensing device, the first signal and the second signal output from the solid-state image sensing apparatus may each comprise a plurality of color signals, and the signal processing circuit may perform white balance adjustment of the supplied signals.

The color signals constituting the supplied signal the level of which is linearly proportional to the incident light are multiplied by a predetermined value to perform the white balance adjustment at the signal processing circuit.

The signal processing circuit may perform gamma correction of the supplied signals. The supplied signal the level of which is linearly proportional to the incident light is raised to the power of $\gamma$ to perform the gamma correction at the signal processing circuit.

In still another embodiment of the invention, a solid-state image sensing apparatus having a solid-state image sensing device that outputs an electric signal proportional to the intensity of the incident light, wherein the solid-state image sensing device is capable of outputting a first signal converted linearly to the intensity of the incident light and a second signal converted natural-logarithmically to the intensity of the incident light, and comprises: a first signal processing circuit that is supplied with the second signal from the solid-state image sensing apparatus and performs a predetermined signal processing; a linear/logarithmic conversion circuit that converts the first signal to a signal natural-logarithmically proportional to the intensity of the incident light; and a second signal processing circuit supplied with a signal from the first signal processing circuit and a signal from the linear/logarithmic conversion circuit.

In this solid-state image sensing apparatus, a plurality of color filters may be provided in the solid-state image sensing device, the first signal and the second signal output from the solid-state image sensing apparatus may each comprise a plurality of color signals, and the second signal processing circuit may perform white balance adjustment of the supplied signals.

At the second signal processing circuit, a predetermined offset level is added to the color signals constituting the supplied signal, the level of which is natural-logarithmically proportional to the incident light to perform the white balance adjustment.

Moreover, the second signal processing circuit may perform gamma correction of the supplied signals. The supplied signal, the level of which is natural-logarithmically proportional to the incident light, is multiplied by γ to perform the gamma correction at the second signal processing circuit.

Additionally, the dynamic range of the second signal may be adjusted at the first signal processing circuit.

In another embodiment of the invention, there is a solid-state image sensing apparatus having a solid-state image sensing device that outputs an electric signal proportional to the intensity of the incident light, and characterized in that the solid-state image sensing device is capable of outputting a first signal converted linearly to the intensity of the incident light and a second signal converted natural-logarithmically to the intensity of the incident light, and comprises: a linear/logarithmic conversion circuit that converts the first signal to a signal natural-logarithmically proportional to the intensity of the incident light; and a signal processing circuit supplied with the second signal and a signal from the linear/logarithmic conversion circuit.

In still another embodiment of the invention, there is a solid-state image sensing apparatus having a solid-state image sensing device that outputs an electric signal proportional to the intensity of the incident light, and characterized in that the solid-state image sensing device is capable of outputting a first signal converted linearly to the intensity of the incident light and a second signal converted natural-logarithmically to the intensity of the incident light, and comprises: a first signal processing circuit that is supplied with the first signal from the solid-state image sensing apparatus and performs a predetermined signal processing; a second signal processing circuit that is supplied with the second signal from the solid-state image sensing apparatus and performs a predetermined signal processing; a linear/logarithmic conversion circuit that converts a signal output from the first signal processing circuit to a signal natural-logarithmically proportional to the intensity of the incident light; and a third signal processing circuit supplied with a signal from the second signal processing circuit and a signal from the linear/logarithmic conversion circuit.

In this solid-state image sensing apparatus, a plurality of color filters may be provided in the solid-state image sensing device. The first signal and the second signal output from the solid-state image sensing apparatus may each comprise a plurality of color signals. The first signal processing circuit may perform white balance adjustment of the first signal, and the second signal processing circuit may perform white balance adjustment of the second signal.

At the first signal processing circuit, the color signals constituting the first signal are multiplied by a predetermined value to perform the white balance adjustment. At the second signal processing circuit, a predetermined offset level is added to the color signals constituting the second signal to perform the white balance adjustment.

Moreover, the first signal processing circuit may perform gamma correction of the first signal, and the second signal processing circuit may perform gamma correction of the second signal.

At the first signal processing circuit, the first signal is raised to the power of γ to perform the gamma correction. At the second signal processing circuit, the second signal is multiplied by γ to perform the gamma correction.

Additionally, the dynamic range of the second signal may be adjusted at the second signal processing circuit.

Preferred embodiments of the present invention will hereinafter be described.

Solid-State Image Sensing Device

1. Structure of the Solid-State Image Sensing Device

FIG. 1 schematically shows the structure of a part of a two-dimensional MOS-type solid-state image sensing apparatus according to another embodiment of the present invention. In the figure, G11 to Gmn represent pixels arranged in matrix form. Reference number 2 represents a vertical scanning circuit that successively scans lines 4-1, 4-2, . . . and 4-n. Reference number 3 represents a horizontal scanning circuit that successively reads in a horizontal direction photoelectric conversion signals directed from pixels to output signal lines 6-1, 6-2, . . . and 6-m for each pixel. Reference number 5 represents a power line. While not only the lines 4-1, 4-2, . . . and 4-n, the output signal lines 6-1, 6-2, . . . 6-m and the power line 5 but also other lines (for example, a clock line and a bias supply line) are connected to each pixel, these are not shown in FIG. 1.

A pair of N-channel MOS transistors Q1 and Q2 are provided for each of the output signal lines 6-1, 6-2, . . . 6-m as shown in the figure. Explaining with the output signal line 6-1 as an example, the gate of the MOS transistor Q1 is connected to a direct current voltage line 7, the drain thereof is connected to the output signal line 6-1, and the source thereof is connected to a line 8 of a direct current voltage VPS'. The drain of the MOS transistor Q2 is connected to the output signal line 6-1, the source thereof is connected to the final signal line 9, and the gate thereof is connected to the horizontal scanning circuit 3.

Figure 2:
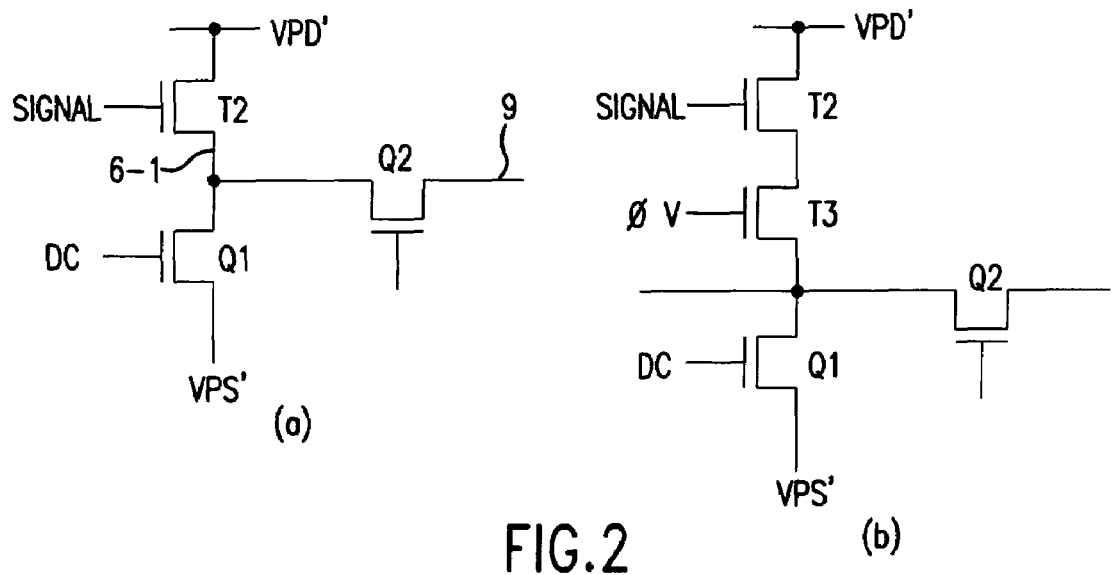
FIG. 2 is a view showing a portion of FIG. 1.

In each of the pixels G11 to Gmn, an N-channel MOS transistor T2 that outputs a signal based on the optical charge generated in the pixel is provided as described later. The connection between the MOS transistor T2 and the MOS transistor Q1 is as shown in (a) of FIG. 2. Here, the relationship between the direct current voltage VPS' connected to the source of the MOS transistor Q1 and a direct current voltage VPD' connected to the drain of the MOS transistor T2 is VPD'>VPS', and the direct current voltage VPS' is, for example, a ground voltage (earth). In this circuit structure, a signal is input to the gate of the preceding MOS transistor T2, and a direct current voltage DC is always applied to the gate of the succeeding MOS transistor Q1. Consequently, the succeeding MOS transistor Q1 is equivalent to a resistor or a constant current source, and the circuit of (a) of FIG. 2 is a source follower amplifier circuit. In this case, it can be considered that it is a current that is amplified and output by the MOS transistor T2.

The MOS transistor Q2 is controlled by the horizontal scanning circuit 3, and acts as a switching element. As described later, in each pixel, an N-channel MOS transistor T3 for switching is also provided. Showing the MOS transistor T3 as well, the circuit of (a) of FIG. 2 is, precisely, as shown in (b) of FIG. 2. That is, the MOS transistor T3 is inserted between the MOS transistor Q1 and the MOS transistor T2. Here, the MOS transistor T3 performs a line selection, and the transistor Q2 performs a row selection.

By the structure as shown in FIG. 2, a signal with a high gain can be output. Consequently, in a case where the pixels natural-logarithmically convert the photoelectric current generated from the photosensitive element to increase the dynamic range, the output signal which is low when unprocessed is amplified into a sufficiently high signal by the amplifier circuit, so that the processing at the succeeding signal processing circuit (not shown) is facilitated.

2. First Example of Pixel Structure

Figure 3:
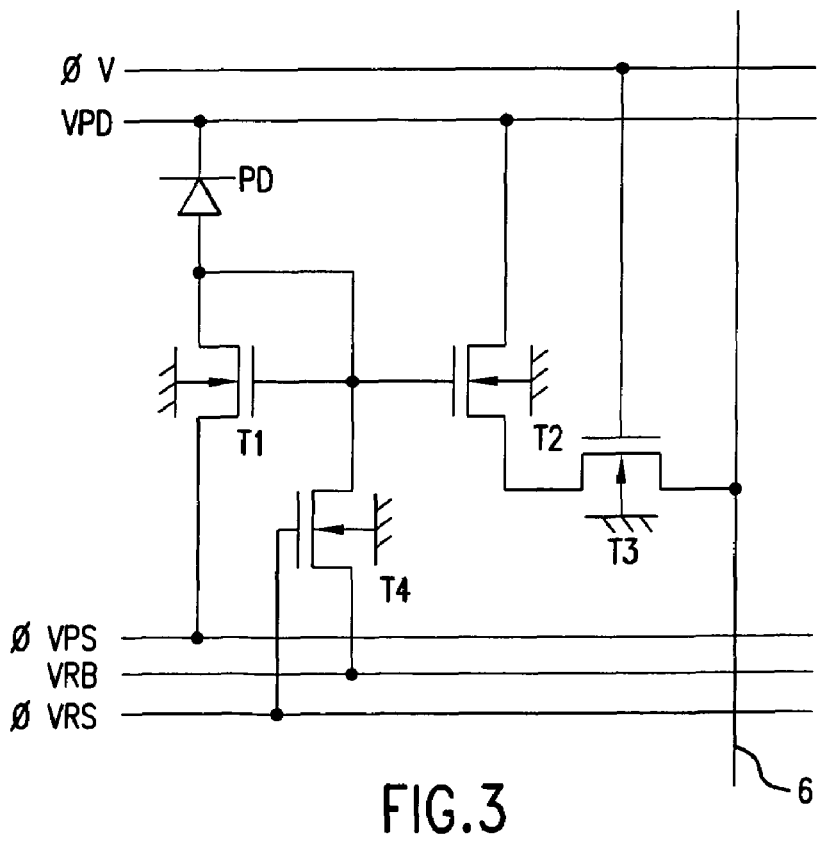
FIG. 3 is a circuit diagram showing an example of the structure of the pixels in the solid-state image sensing device of FIG. 1.

A first example applied to each pixel of the solid-state image sensing device shown in FIG. 1 will be described with reference to a drawing. FIG. 3 is a circuit diagram showing the structure of the pixels provided in a solid-state image sensing apparatus used for this embodiment.

In FIG. 3, a p-n photodiode PD forms a photosensitive portion (photoelectric conversion portion). The anode of the photodiode PD is connected to the drain and the gate of the MOS transistor T1, the gate of the MOS transistor T2 and the drain of a MOS transistor T4. The source of the MOS transistor T2 is connected to the drain of the MOS transistor T3 for the line selection. The source of the MOS transistor is connected to an output signal line 6 (this output signal line 6 corresponds to the lines 6-1, 6-2, ... 6-m of FIG. 1). The MOS transistors T1 to T4 are N-channel MOS transistors, and are grounded at the back gates thereof.

A direct current voltage VPD is applied to the cathode of the photodiode PD. A signal ØVPS is applied to the source of the MOS transistor T1. A direct current VRB is applied to the source of the MOS transistor T4, and a signal ØVRS is input to the gate thereof. A direct current voltage VPD is input to the drain of the MOS transistor T2. A signal ØV is input to the gate of the MOS transistor T3. In this example, the signal ØVPS changes between two values; the level of the voltage for causing the MOS transistors T1 and T2 to operate in a subthreshold region is the low level, and the level of the voltage substantially the same as the direct current voltage VPD is the high level.

In this example, by changing the bias of the MOS transistor T1 by switching the voltage value of the signal ØVPS, the following occurs: a case where an output signal directed to the output signal line 6 in a single pixel is converted natural-logarithmically to an electric signal that the photodiode PD outputs in accordance with the incident light (hereinafter, this electric signal will be referred to as "photoelectric current"); and a case where the output signal is converted linearly to the photoelectric current. These cases will be described.

(1) The Case where the Photoelectric Current is Output After Natural-logarithmically Converted First, an operation when the signal ØVPS is low and the MOS transistors T1 and T2 are biased so as to operate in the subthreshold region will be described. At this time, since a signal ØVRS of low level is supplied to the gate of the MOS transistor T4, the MOS transistor T4 is off, which is substantially equivalent to a case where the MOS transistor T4 is absent.

In the circuit of FIG. 3, when light is incident on the photodiode PD, a photoelectric current is generated Due to the subthreshold characteristic of the MOS transistors, a voltage of a value to which the photoelectric current is natural-logarithmically converted occurs at the gates of the MOS transistors T1 and T2. Consequently, a drain current of a value natural-logarithmically proportional to the photoelectric current attempts to flow through the MOS transistor T2. Then, the pulse signal ØV is supplied to the gate of the MOS transistor T3 to turn on the MOS transistor T3. Then, a drain current of a value natural-logarithmically proportional to the photoelectric current is directed to the output signal line 6 through the MOS transistor T3.

At this time, the resistance when the MOS transistor T2 and the MOS transistor Q1 (FIG. 2) are conducting, and the drain voltage of the MOS transistor Q1 depending on the current flowing through the transistors T2 and Q1, occur on the output signal line 6 as a signal. After the signal is read out, the MOS transistor T3 is turned off. By repeating this operation at predetermined time intervals, subject images changing from moment to moment can be continuously imaged in a wide dynamic range. When the output current is converted natural-logarithmically to the intensity of the incident light as described above, the signal ØVRS is always low.

(2) The Case where the Photoelectric Current is Output after Linearly Converted

Next, an operation when the signal ØVPS is high will be described. At this time, the MOS transistor T1 is substantially off, and no current flows between the source and the drain of the MOS transistor T1. Moreover, the signal ØVRS supplied to the gate of the MOS transistor T4 is maintained low, and the MOS transistor T4 is turned off.

When light is incident on the photodiode PD in this state, a photoelectric current is generated. At this time, since a capacitor is formed between the back gate and the gate of the MOS transistor T1 or by the junction capacitance of the photodiode PD, charges by the photoelectric current are mainly accumulated at the gates of the MOS transistors T1 and T2. Consequently, the gate voltages of the MOS transistors T1 and T2 are proportional to the integral value of the photoelectric current, and the a drain current of a value linearly proportional to the photoelectric current attempts to flow through the MOS transistor T2.

Then, the pulse signal ØV is supplied to the gate of the MOS transistor T3 to turn on the MOS transistor T3. Then, a drain current of a value linearly proportional to the photoelectric current is directed to the output signal line 6 through the MOS transistor T3. At this time, the resistance when the MOS transistor T2 and the MOS transistor Q1 (FIG. 2) are conducting and the drain voltage of the MOS transistor Q1 depending on the current flowing through the transistors T2 and Q1 occur on the output signal line 6 as a signal. After the signal is thus read out, the MOS transistor T3 is turned off.

In this manner, a signal (output current) proportional to the intensity of the incident light can be read out. Thereafter, by turning off the transistor T3 and then, supplying a signal ØVRS of high level to the gate of the MOS transistor T4, the MOS transistor T4 is turned on, thereby initializing the photodiode PD, the drain voltage of the transistor T1 and the gate voltages of the transistors T1 and T2. By repeating this operation at predetermined time intervals, subject images changing from moment to moment can be continuously imaged in an excellent SN-ratio condition.

3. Second Example of Pixel Structure

Figure 4:
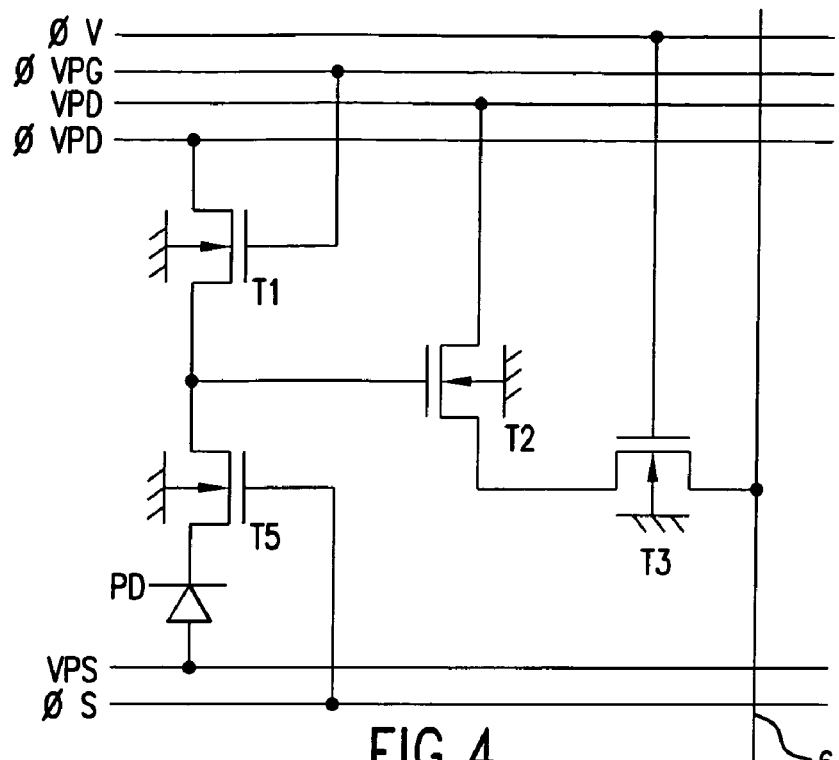
FIG. 4 is a circuit diagram showing an example of the structure of the pixels in the solid-state image sensing device of FIG. 1.

A second example applied to each pixel of the solid-state image sensing device shown in FIG. 1 will be described with reference to drawings. FIG. 4 is a circuit diagram showing the structure of the pixels provided in a solid-state image sensing apparatus used for this embodiment.

As shown in FIG. 4, in this embodiment, the MOS transistors T2 and T3 constituting the output side of each pixel have a similar structure as those of each pixel of FIG. 3. In such a pixel of FIG. 4, the direct current voltage VPS is applied to the anode of the photodiode PD, a signal ØVPD is supplied to the drain of the MOS transistor T1, and the source thereof is connected to the gate of the MOS transistor T2. A MOS transistor T5 is provided the drain of which is connected to the source of the MOS transistor T1 and the source of which is connected to the cathode of the photodiode PD. A signal ØVPG is supplied to the gate of the MOS transistor T1, and a signal ØS is supplied to the gate of the MOS transistor T5. (1) The case where the photoelectric current is output after natural-logarithmically converted At this time, for the signal ØVPD, a voltage for causing the MOS transistor T1 to operate in the subthreshold region is a first voltage, and a voltage of a value substantially equal to the value of the direct current voltage VPS for detecting variations in the threshold value of the MOS transistor T1 is a second voltage.

(1-a) Imaging

The signal ØVPD is set at the first voltage to cause the MOS transistor T1 to operate in the subthreshold region, and the signal ØS supplied to the gate of the MOS transistor T5 is made high to turn on the MOS transistor T5. When light is incident on the photodiode PD in this state, a photoelectric current is generated, and because of a subthreshold characteristic of the MOS transistors, a voltage of a value to which the photoelectric current is natural-logarithmically converted occurs at the source of the MOS transistor T1 and the gate of the MOS transistor T2. At this time, since a negative optical charge generated at the photodiode PD flows into the source of the MOS transistor T1, the more intense the incident light is, the lower the source voltage of the MOS transistor T1 is.

When a voltage changed natural-logarithmically to the photoelectric current thus occurs at the gate of the MOS transistor T2, the pulse signal ØV is supplied to turn on the MOS transistor T3, so that a current of a value to which the photoelectric current is natural-logarithmically converted is directed to the output signal line 6 through the MOS transistors T2 and T3. After a signal (output current) proportional to the logarithmic value of the intensity of the incident light is read out in this manner, the MOS transistor T3 is turned off.

(1-b) Sensitivity Variation Detection

Figure 5:
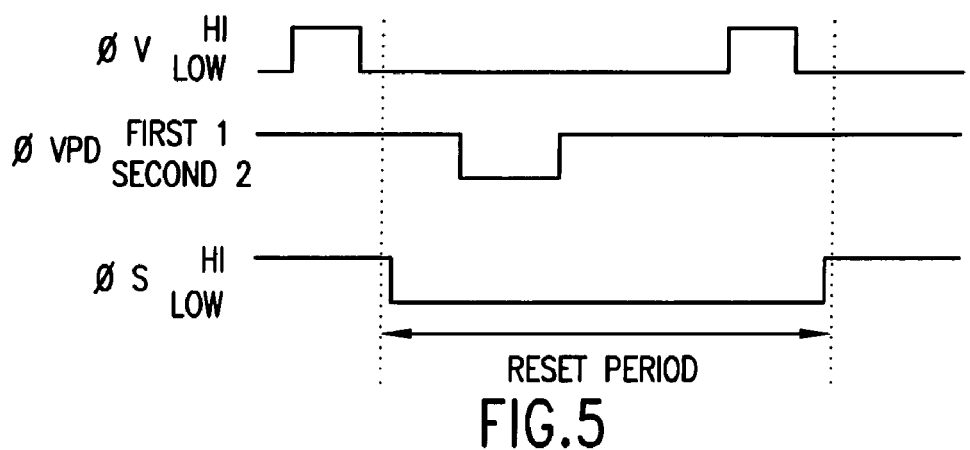
FIG. 5 illustrates a time chart showing the operation of the signals supplied to the elements of the pixels of FIG. 4.

A timing chart of signals when variations in the sensitivity of each pixel are detected is shown in FIG. 5. After the pulse signal ØV is supplied to the gate of the MOS transistor T3 and the output signal is read out as described above, first, the signal ØS is made low to turn off the MOS transistor T5. Then, the signal ØVPD is set at the second voltage, and a negative charge is accumulated between the drain and the source of the MOS transistor T1.

Then, the signal ØVPD is returned to the first voltage. Then, the accumulated negative charge flows out to the signal line of the signal ØVPD, so that the negative charge is accumulated at the source of the MOS transistor T1. The amount of accumulation of this negative charge depends on the gate-source threshold voltage. When the negative charge is accumulated at the source of the MOS transistor T1 as described above, the pulse signal ØV is supplied to the gate of the MOS transistor T3 to read an output signal.

At this time, the value of the read output signal is proportional to the threshold voltage of the MOS transistor T1, whereby variations in the sensitivity of each pixel can be detected. Lastly, in to perform imaging, the signal ØS is made high to turn on the MOS transistor T5. By storing the signal obtained by detecting variations in the detected sensitivity in a memory (such as a line memory) as correction data, and correcting the output signal in actual imaging by use of the correction data for each pixel, the components due to the variations of the pixel can be removed from the output signal.

(2) The Case where the Photoelectric Current is Output after Linearly Converted

At this time, the voltage of the signal ØVPD is a third voltage serving as the operating point of the MOS transistor T2. Moreover, the signal ØS is always high, and the MØS transistor T5 the gate of which is supplied with the signal ØS is always on.

(2-a) Imaging

First, the signal ØVPG is made low to turn off the MOS transistor T1 for resetting. When the MOS transistor T1 for resetting is turned off as described above, the photoelectric current flows through the photodiode PD to change the gate voltage of the MOS transistor T2. That is, a negative optical charge is supplied from the photodiode PD to the gate of the MOS transistor T2, so that the gate voltage of the MOS transistor T2 becomes a value changed linearly to the photoelectric current. At this time, since the negative optical charge generated at the photodiode PD flows into the gate of the MOS transistor T2, the more intense the incident light is, the lower the gate voltage of the MOS transistor T2 is.

When a voltage changed linearly to the photoelectric current occurs at the gate of the MOS transistor T2, the pulse signal ØV is supplied to turn on the MOS transistor T3. At this time, a current of a value to which the integral value of the photoelectric current is linearly converted is directed to the output signal line 6 through the MOS transistors T2 and T3. After a signal (output current) proportional to the integral value of the intensity of the incident light is read out in this manner, the MOS transistor T3 is turned off.

(2-b) Resetting

Figure 6:
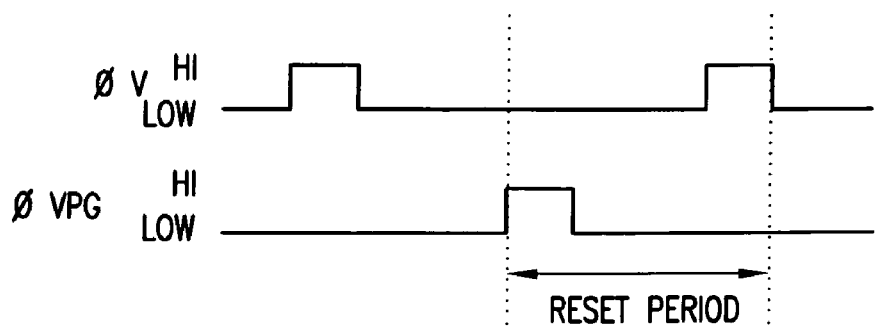
FIG. 6 illustrates a time chart showing the operation of the signals supplied to the elements of the pixels of FIG. 4.

A timing chart of signals when the pixels are reset is shown in FIG. 6. After the pulse signal ØV is supplied to the gate of the MOS transistor T3 and the output signal is read out as described above, first, the signal ØVPG is made high to turn on the MOS transistor T1. When the MOS transistor T1 is turned on as described above, the third voltage is supplied to the gate of the MOS transistor T2, so that the gate voltage of the MOS transistor T2 is reset. Then, the signal ØVPG is made low to turn off the MOS transistor T1.

Then, the pulse signal ØV is supplied to the gate of the MOS transistor T3, and an output signal is read out. At this time, the value of the output signal is proportional to the gate voltage of the MOS transistor T2, and is read out as the output signal when the photodiode PD and the like are initialized. After the output signal is read out, the above-described imaging is performed again. By storing the signal when the photodiode PD and the like are initialized in a memory (such as a line memory) as correction data, and correcting the output signal in actual imaging by use of the correction data for each pixel, the components due to the variations of the pixel can be removed from the output signal.

As described above, in the first and the second examples, by a simple potential manipulation, the output characteristic can be changed among a plurality of characteristics in the same pixel independently of the intensity of the incident light. That is, even if the intensity of the light incident on the photosensitive element (photodiode PD) is the same, based on the signal sent to each pixel, switching can be made between a condition outputting the signal after arbitrarily logarithmically converting it and a condition outputting the signal after linearly converting it.

The structure of the pixels provided in the solid-state image sensing device is not limited to the structures of FIGS. 3 and 4, but may be, for example, a structure having an integrating circuit or an amplifier circuit in the rear of the MOS transistor T2 or a circuit structure using P-channel MOS transistors that are opposite in polarity.

The solid-state image sensing device thus structured is common to the embodiments described below. The embodiments of a solid-state image sensing apparatus having a solid-state image sensing device of such a structure will now be described.

First Exemplary Embodiment

Figure 7:
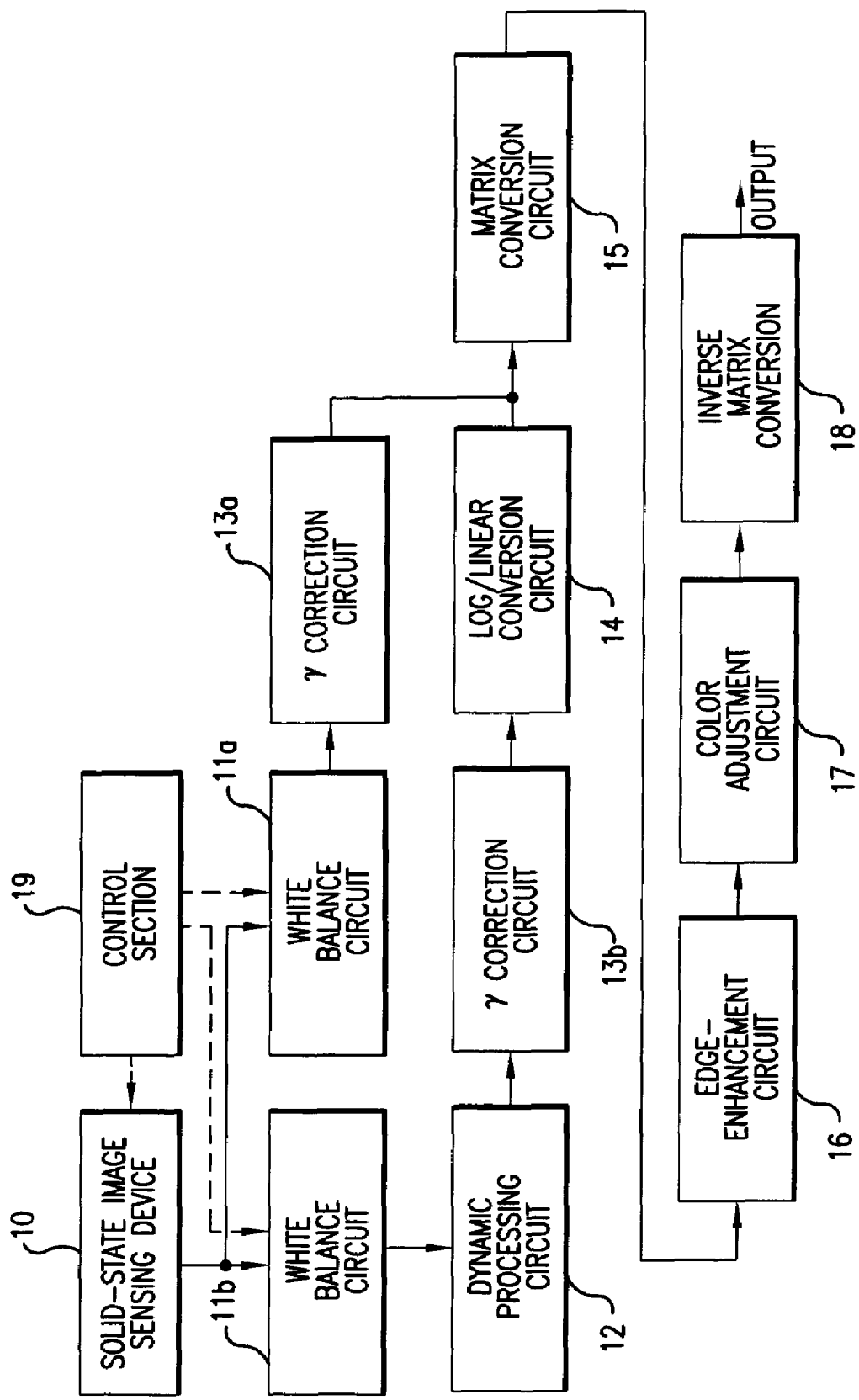
FIG. 7 is a block diagram showing the internal structure of the solid-state image sensing apparatus according to the first embodiment.

A first exemplary embodiment of the present invention will be described with reference to FIG. 7. FIG. 7 is a block diagram showing the internal structure of a solid-state image sensing apparatus according to the embodiment.

The solid-state image sensing apparatus shown in FIG. 7 has a solid-state image sensing device 10 that outputs an electric signal converted natural-logarithmically or linearly to the incident light as described above, and processes the electric signal output from the solid-state image sensing device. The solid-state image sensing apparatus is provided with a white balance circuit 11a that performs white balance adjustment on the electric signal linearly converted by the solid-state image sensing device 10, a white balance circuit 11b that performs white balance adjustment on the electric signal natural-logarithmically converted by the solid-state image sensing device 10, a dynamic processing circuit 12 that performs dynamic range adjustment on the electric signal output from the white balance circuit 11b, a gamma correction circuit 13a that performs gamma correction on the electric signal from the white balance circuit 11a, a gamma correction circuit 13b that performs gamma correction on the electric signal from the dynamic processing circuit 12, and a logarithmic/linear conversion circuit 14 that converts the electric signal from the gamma correction circuit 13b to an electric signal converted linearly to the incident light.

The solid-state image sensing apparatus is further provided with a matrix conversion circuit (signal processing circuit) 15 that generates a luminance signal and a color-difference signal from the electric signal from the gamma correction circuit 13a or the logarithmic/linear conversion circuit 14, an edge enhancement circuit 16 that performs edge enhancement based on the luminance signal and the color-difference signal output from the matrix conversion circuit 15, a color adjustment circuit 17 that performs color adjustment on the edge-enhanced signals, an inverse matrix conversion circuit 18 that converts the luminance signal and the color-difference signal output from the color adjustment circuit 17 to three signals of R, G and B, and a control portion 19 that controls operations of the solid-state image sensing device 10 and the white balance circuits 11a and 11b.

In the solid-state image sensing apparatus, a color filter of one of the three primary colors, red, green and blue is provided in the photoelectric conversion portion of each of the pixels G11 to Gmn in the solid-state image sensing device 10. By the pixels each provided with a color filter of red, green or blue as described above, an R signal, a G signal or a B signal is output. When such R, G and B signals are output, the white balance circuits 11a and 11b perform white balance adjustment in accordance with the levels of the R, G and B signals output from the solid-state image sensing device 10.

When the solid-state image sensing device 10 is controlled so as to perform linear conversion by the control portion 19, the control portion 19 turns on the white balance circuit 11a and turns off the white balance circuit 11b. At this time, at the white balance circuit 11a, the level of each of the R, G and B signals output from the solid-state image sensing device 10 is multiplied by a predetermined value. Then, the levels of the R, G and B signals multiplied by the predetermined value are integrated every field.

When the G signal is the reference, a value for the R signal (by which the integral value of the R signal is multiplied such that the integral value of the R signal and the integral value of the G signal are the same) is obtained, and a value for the B signal (by which the integral value of the B signal is multiplied such that the integral value of the B signal and the integral value of the G signal are the same) is obtained. The level of the R signal multiplied by the predetermined value, as described above, is multiplied by the value for the R signal obtained The level of the B signal multiplied by the predetermined value, as described above, is multiplied by the value for the B signal. The R and B signals obtained and the G signal multiplied by the predetermined value, as described above, are output from the white balance circuit 11a. Thus, the R, G and B signals obtained by the solid-state image sensing device 10 performing linear conversion are white-balance-adjusted at the white balance circuit 11a, and are output to the gamma correction circuit 13a.

That is, when the levels of the R, G and B signals are Dr, Dg and Db, respectively, and the predetermined values by which the R, G and B signals are multiplied are xr, xg and xb, respectively, the levels of the R, G and B signals become xr×Dr, xg×Dg and xb×Db, respectively. When the integral values, corresponding to one field, of the R, G and B signals the levels of which are thus converted are Drl, Dgl and Dbl, respectively, the ratio Dgl/Drl of the integral value of the G signal to the integral value of the R signal and the ratio Dgl/Dbl of the integral value of the G signal to the integral value of the B signal are obtained, and the ratios are set as the value for the R signal and the value for the B signal, respectively. Therefore, when an R signal of the level Dr, a G signal of the level Dg and a B signal of the level Db are input, an R signal of a level Dgl/Drl×xr×Dr, a G signal of a level xg×Dg and a B signal of a level Dgl/Dbl×xb×Db are output.

When the R, G and B signals white-balance-adjusted at the white balance circuit 11a are supplied to the gamma correction circuit 13a, gamma correction is performed at the gamma correction circuit 13a. That is, when the level of the signal input to the gamma correction circuit 13a is D, the level of the signal output from the gamma correction circuit 13a is D to the power of γ, $D^\gamma$. The gamma correction circuit 13a has a non-illustrated look up table (LUT), and gamma-corrected signal levels corresponding to the levels of the input signals are stored in the LUT. Therefore, when a signal of the level D is input to the gamma correction circuit 13a, the signal level $D^\gamma$ corresponding to the signal level D is read from the LUT, and a signal of the signal level $D^\gamma$ is output to thereby gamma-correct the input signal. The R, G and B signals gamma-corrected in this manner are sent to the matrix conversion circuit 15.

When the solid-state image sensing device 10 is controlled so as to perform logarithmic conversion by the control portion 19, the control portion 19 turns off the white balance circuit 11a and turns on the white balance circuit 11b. At this time, at the white balance circuit 11b, a predetermined offset level is added to the level of each of the R, G and B signals output from the solid-state image sensing device 10. Then, the levels of the R, G and B signals to which the predetermined offset level is added are integrated every field.

When the G signal is the reference, an offset level for the R signal added to the integral value of the R signal such that the integral value of the R signal and the integral value of the G signal are the same is obtained, and an offset level for the B signal added to the integral value of the B signal such that the integral value of the B signal and the integral value of the G signal are the same is obtained. The offset level for the R signal obtained is added to the level of the R signal to which the predetermined offset level is added as described above, and the offset level for the B signal is added to the level of the B signal to which the predetermined offset level is added as described above.

The R and the B signals obtained and the G signal to which the predetermined offset level is added as described above are output from the white balance circuit 11b. Thus, the R, G and B signals obtained by the solid-state image sensing device 10 performing logarithmic conversion are white-balance-adjusted at the white balance circuit 11b, and are output to the dynamic processing circuit 12.

That is, when the levels of the R, G and B signals are Dra, Dga and Dba, respectively, and the predetermined offset levels added to the R, G and B signals are yr, yg and yb, respectively, the levels of the R, G and B signals become Dra+yr, Dga+yg and Dba+yb, respectively. When the integral values, corresponding to one field, of the R, G and B signals the levels of which are converted are Dral, Dgal and Dbal, respectively, the difference Dgal-Dral between the integral values of the R and G signals and the difference Dgal-Dbal between the integral values of the B and G signals are obtained, and the differences are set as the value for the R signal and the value for the B signal, respectively. Therefore, when an R signal of the level Dra, a G signal of the level Dga and a B signal of the level Dba are input, an R signal of a level (Dgal−Dral)+Dra+yr, a G signal of a level Dga+yg and a B signal of a level (Dgal−Dbal)+Dba+yb are output.

At the white balance circuit 11b, since the input signals are signals converted natural-logarithmically to the incident light, the values by which the signals are multiplied at the white balance circuit 11a occur as the offset levels added to the signals. This is because the ratios A/B of the signals converted linearly to the incident light correspond to the differences ln(A)-ln(B) between the signals converted logarithmically to the incident light.

When the R, G and B signals are sent from the white balance circuit 11b to the dynamic processing circuit 12, at the dynamic processing circuit 12, the widths of the dynamic ranges of the input R, G and B signals are adjusted to the width of the dynamic range for the processing at the gamma correction circuit 13b and succeeding circuits. That is, for example, when R, G and B signals corresponding to one field are input to the dynamic processing circuit 12, the highest and the lowest ones of the levels of the input R, G and B signals corresponding to one field are detected to thereby detect the dynamic ranges of the input R, G and B signals.

The input R, G and B signals are output after level-converting so that the level of the signal of the detected lowest level is 0 and the level of the signal of the detected highest level is 255 when treated as 8-bit digital signals at the gamma correction circuit 13b. By doing this, the input R, G and B signals can be sent to the gamma correction circuit 13b as signals having dynamic ranges of 8-bit signal levels of 0 to 255.

When the solid-state image sensing device 10 performs logarithmic conversion, although the dynamic range is as wide as five to six digits, only three to four digits are used even when the subject is imaged with the luminance distribution being in a high luminance condition Hence, parts where there is no data occur in high-luminance and low-luminance parts. Consequently, the part where the luminance is lowest in the luminance distribution of the imaged subject is reproduced as light gray, and the part where the luminance is highest is reproduced as dark gray. Thus, when an image is reproduced by use of signals not dynamic-processed, a low-contrast image is reproduced.

On the other hand, since the part where there is no data is deleted and the signals are converted to ones adjusted to the dynamic range of the output side at the dynamic processing circuit 12, a high-contrast image can be reproduced. The dynamic processing circuit 12 may set a luminance range of the subject in accordance with the condition of the luminance distribution of the subject and convert the signals to ones adjusted to the dynamic range suitable for the luminance range.

The R, G and B signals having been dynamic-processed are gamma-corrected at the gamma correction circuit 13b. That is, when the level of the signal input to the gamma correction circuit 13b is Da, the level of the signal output from the gamma correction circuit 13b is the product of the signal level Da and $\gamma$, $\gamma \times Da$. As described above, at the gamma correction circuit 13b, since the input R, G and B signals are only multiplied by $\gamma$, a LUT for obtaining the levels of the output signals with respect to the levels of the input signals is unnecessary unlike at the gamma correction circuit 13a, and the gamma correction circuit 13b is formed of a multiplier circuit for multiplying $\gamma$.

At the gamma correction circuit 13b, since the input signals are signals converted natural-logarithmically to the incident light, the value $\gamma$ to the power of which the signals are raised at the gamma correction circuit 13a occurs as the value $\gamma$ by which the signals are multiplied. Since the relationship between the level D of the signal converted linearly to the incident light and the level Da of the signal converted logarithmically to the incident light is Da=ln(D), whereas the level of the linearly converted signal becomes $D^\gamma$ by gamma correction, the levels of the logarithmically converted signals become $\ln(D^\gamma)=\gamma \times Da$ by gamma correction.

The R, G and B signals gamma-corrected at the gamma correction circuit 13b are sent to the logarithmic/linear conversion circuit 14, and are converted to R, G and B signals of levels linearly proportional to the intensity of the light incident on the solid-state image sensing device 10. That is, when a signal of a level Dx is input to the logarithmic/linear conversion circuit 14, a signal of a level Dy=a×exp(Dx) (a is a constant) is output. Thus, R, G and B signals of levels linearly proportional to the intensity of the incident light are sent from the logarithmic/linear conversion circuit 14 to the matrix conversion circuit 15.

As described above, the R, G and B signals obtained by the solid-state image sensing device 10 performing linear conversion pass through the white balance circuit 11a and the gamma correction circuit 13a. Alternatively, the R, G and B signals obtained by the solid-state image sensing device 10 performing logarithmic conversion pass through the white balance circuit 11b, the dynamic processing circuit 12, the gamma correction circuit 13b and the linear/logarithmic conversion circuit 14 to undergo white balance adjustment and gamma correction and the signals are then sent to the matrix conversion circuit 15 as signals linearly proportional to the intensity of the incident light. Consequently, the matrix conversion circuit 15 and succeeding circuits are for handling signals converted linearly to the intensity of the incident light.

At the matrix conversion circuit 15, a luminance signal and a color-difference signal are generated from the R, G and B signals sent from the gamma correction circuit 13*a* or the logarithmic/linear conversion circuit 14, and the generated signals are sent to the succeeding edge enhancement circuit 16. At the edge enhancement circuit 16, first, the edge portion of the reproduced image is detected base on the levels of the signals. Then, edge enhancement is performed by an operation such as adding a Laplacian that takes a value obtained by quadratically differentiating the luminance signal and the color-difference signal representing the edge portion, and the edge-enhanced signals are sent to the color adjustment circuit 17.

At the color adjustment circuit 17, by performing an operation such as an operation to suppress generation of a false color in the edge-enhanced signals or interpolated signals, the level of the color-difference signal is adjusted so that the contrast of the reproduced image is high. Then, the color-difference signal thus adjusted and the luminance signal are supplied to the inverse matrix conversion circuit 18, and are output after converted to R, G and B signals.

By providing two kinds of white balance circuits and gamma correction circuits, one for processing the electric signals obtained by performing logarithmic conversion and the other for processing the electric signals obtained by performing linear conversion as described above, particularly, the electric signals obtained by performing logarithmic conversion can be processed without the resolution deteriorated. Moreover, since the matrix conversion circuit and succeeding circuits can be shared, the circuit scale can be reduced.

Second Embodiment

Figure 8:
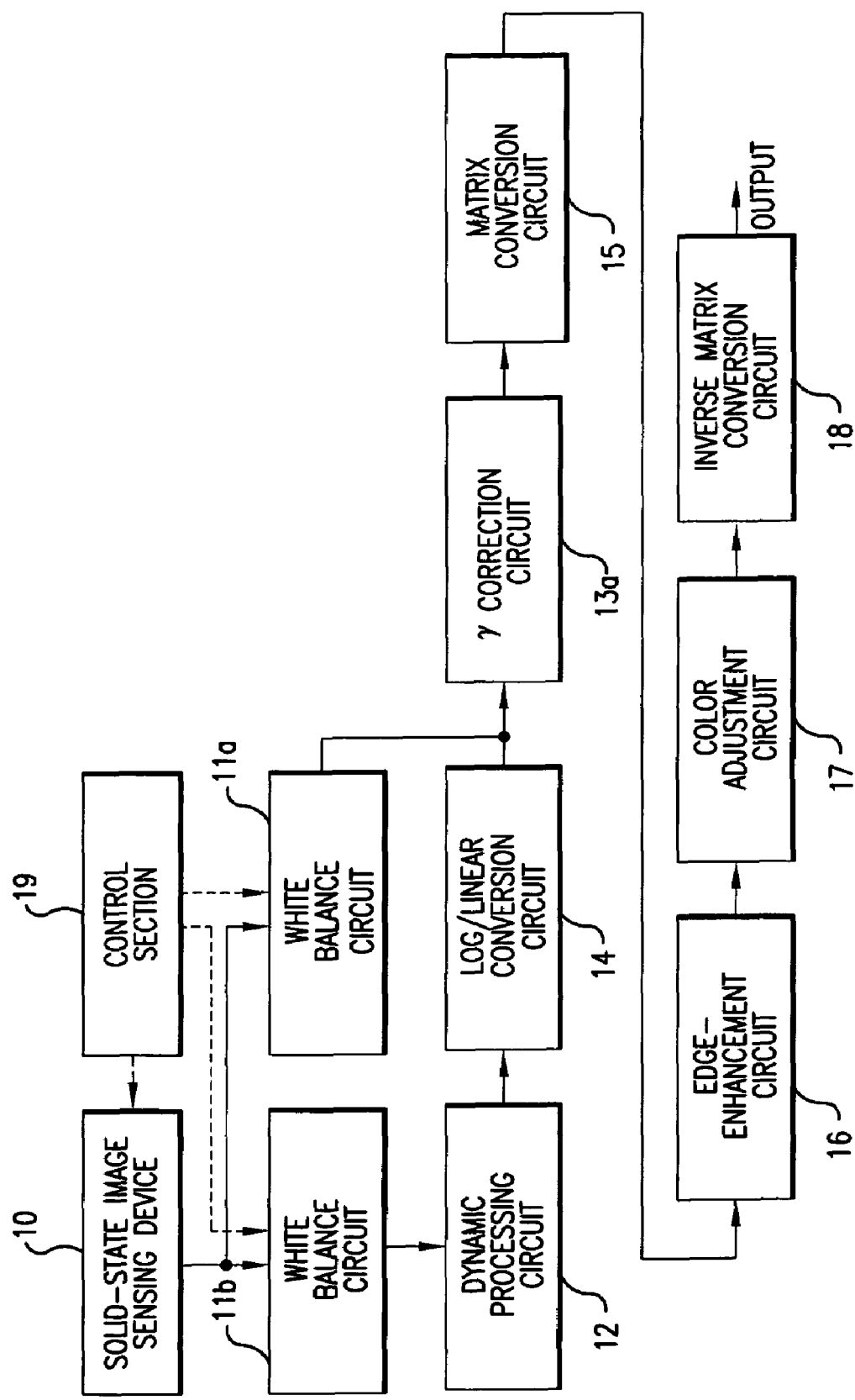
FIG. 8 is a block diagram showing the internal structure of the solid-state image sensing apparatus according to the second embodiment.

A second embodiment of the present invention will be described with reference to FIG. 8. FIG. 8 is a block diagram showing the internal structure of a solid-state image sensing apparatus according to this embodiment. In the solid-state image sensing apparatus according to this embodiment, elements used for the same purposes as those of the solid-state image sensing apparatus shown in FIG. 7 are designated by the same reference numbers, and descriptions thereof are omitted.

In the solid-state image sensing apparatus of FIG. 8, the gamma correction circuit 13*b* provided between the dynamic processing circuit 12 and the logarithmic/linear conversion circuit 14 in the solid-state image sensing apparatus according to the first embodiment (FIG. 7) is deleted, and the output from the white balance circuit 11*a* or the output from the logarithmic/linear conversion circuit 14 is input to the gamma correction circuit 13*a*. Otherwise, the structure is similar to that of the solid-state image sensing apparatus according to the first embodiment.

In such a structure, when the solid-state image sensing device 10 is controlled so as to perform linear conversion by the control portion 19, like in the first embodiment, the control portion 19 turns on the white balance circuit 11*a* and turns off the white balance circuit 11*b*. Consequently, the R, G and B signals obtained by the solid-state image sensing device 10 performing linear conversion are white-balance-adjusted at the white balance circuit 11*a* and are then sent to the gamma correction circuit 13*a*.

When the solid-state image sensing device 10 is controlled so as to perform logarithmic conversion by the control portion 19, the control portion 19 turns off the white balance circuit 11*a* and turns on the white balance circuit 11*b*. Consequently, the R, G and B signals obtained by the solid-state image sensing device 10 performing logarithmic conversion are white-balance-adjusted at the white balance circuit 11*b* and are then converted to signals of levels adjusted to the dynamic range of the output side at the dynamic processing circuit 12. Then, at the logarithmic/linear conversion circuit 14, the R, G and B signals output from the dynamic processing circuit 12 are converted to signals of levels linearly proportional to the intensity of the incident light, and are then sent to the gamma correction circuit 13*a*.

As described above, the R, G and B signals obtained by the solid-state image sensing device 10 performing linear conversion pass through the white balance circuit 11*a*. Alternatively, the R, G and B signals obtained by the solid-state image sensing device 10 performing logarithmic conversion pass through the white balance circuit 11*b*, the dynamic processing circuit 12 and the linear/logarithmic conversion circuit 14 to undergo white balance adjustment. The signals are sent to the gamma correction circuit 13*a* as signals linearly proportional to the intensity of the incident light. Consequently, the gamma correction circuit 13*a* and succeeding circuits are for handling signals converted linearly to the intensity of the incident light.

The gamma correction circuit 13*a* reads the gamma-corrected signal levels corresponding to the levels of the input signals from a non-illustrated LUT, and outputs signals of the read levels to the matrix conversion circuit 15 as new signals. For detailed descriptions of the operations of the matrix conversion circuit 15 and succeeding circuits, refer to the first embodiment; they are omitted because the operations are similar to those of the first embodiment By providing two kinds of white balance circuits, one for processing the electric signals obtained by performing logarithmic conversion and the other for processing the electric signals obtained by performing linear conversion, the electric signals obtained by performing logarithmic conversion can be processed without the resolution deteriorated. Moreover, since the matrix conversion circuit and succeeding circuits can be shared, the circuit scale can be made smaller than that of the solid-state image sensing apparatus according to the first embodiment.

Third Embodiment

Figure 9:
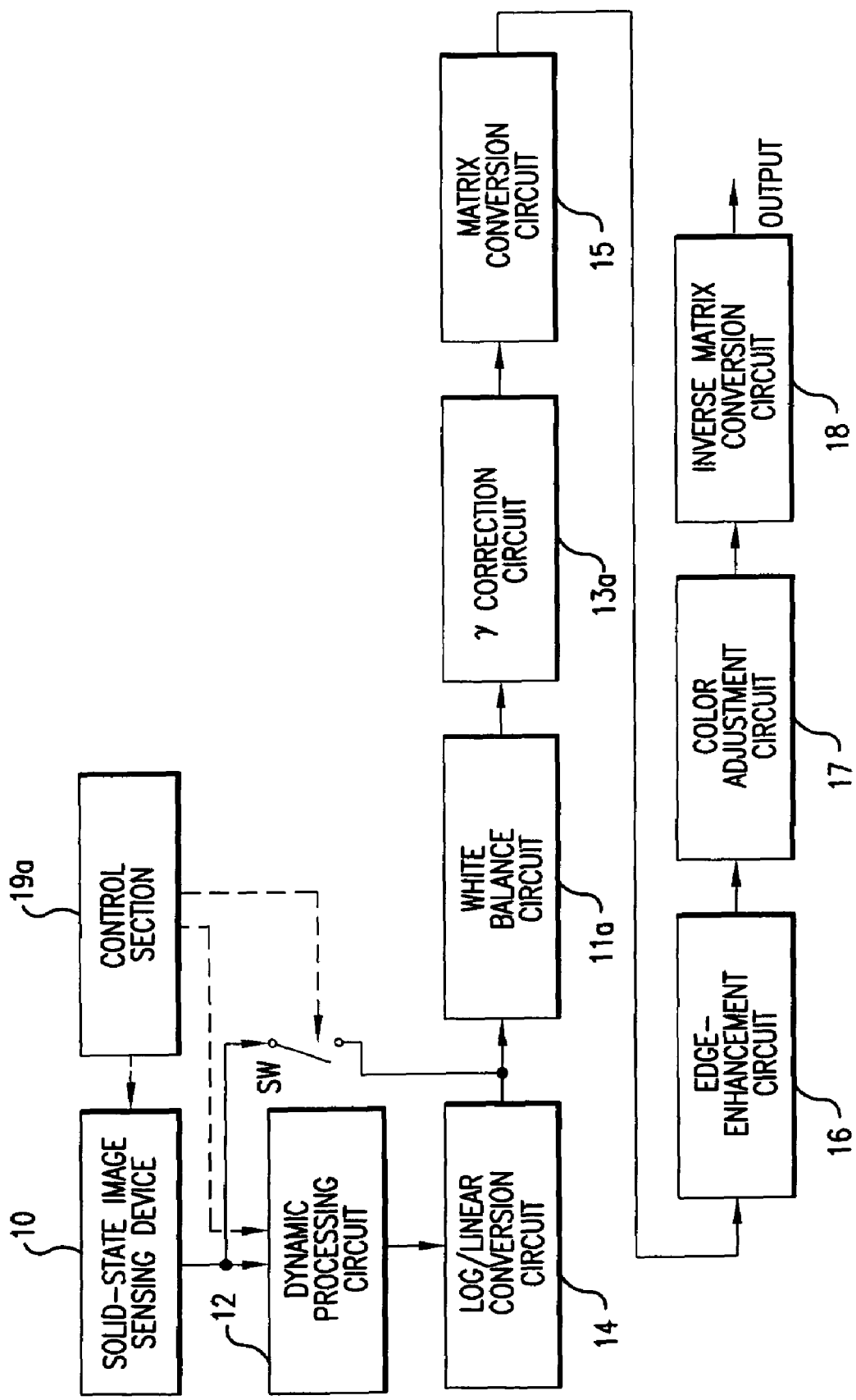
FIG. 9 is a block diagram showing the internal structure of the solid-state image sensing apparatus according to the third embodiment.

A third embodiment of the present invention will be described with reference to FIG. 9. FIG. 9 is a block diagram showing the internal structure of a solid-state image sensing apparatus according to this embodiment. In the solid-state image sensing apparatus according to this embodiment, elements used for the same purposes as those of the solid-state image sensing apparatus shown in FIG. 8 are designated by the same reference numbers, and descriptions thereof are omitted.

In the solid-state image sensing apparatus of FIG. 9, the white balance circuit 11*b* of the solid-state image sensing apparatus according to the second embodiment (FIG. 8) is deleted, and the output from the solid-state image sensing device 10 is input to the white balance circuit 11*a* by way of a switch SW or by way of the dynamic processing circuit 12 and the logarithmic/linear conversion circuit 14. Moreover, a control portion 19*a* controls turning on and off of the dynamic processing circuit 12 and the switch SW. Otherwise, the structure is similar to that of the solid-state image sensing apparatus according to the second embodiment.

In such a structure, when the solid-state image sensing device 10 is controlled so as to perform linear conversion by the control portion 19*a*, the control portion 19*a* turns on the switch SW and turns off the dynamic processing circuit 12. Consequently, the R, G and B signals obtained by the solid-state image sensing device 10 performing linear conversion are sent to the white balance circuit 11a by way of the switch SW.

When the solid-state image sensing device 10 is controlled so as to perform logarithmic conversion by the control portion 19a, the control portion 19a turns off the switch SW and turns on the dynamic processing circuit 12. Consequently, the R, G and B signals obtained by the solid-state image sensing device 10 performing logarithmic conversion are converted to signals of levels adjusted to the dynamic range of the output side at the dynamic processing circuit 12. Then, at the logarithmic/linear conversion circuit 14, the R, G and B signals output from the dynamic processing circuit 12 are converted to signals of levels linearly proportional to the intensity of the incident light, and are then sent to the white balance circuit 11a.

As described above, the R, G and B signals obtained by the solid-state image sensing device 10 performing linear conversion pass through the switch SW or the R, G and B signals obtained by the solid-state image sensing device 10 performing logarithmic conversion pass through the dynamic processing circuit 12 and the linear/logarithmic conversion circuit 14, and are sent to the white balance circuit 11a as signals linearly proportional to the intensity of the incident light. Consequently, the white balance circuit 11a and succeeding circuits are for handling signals converted linearly to the intensity of the incident light.

At the white balance circuit 11a, similar to the first embodiment (FIG. 7), white balance adjustment is performed on the input R, G and B signals by multiplying the levels of the input R, G and B signals by a predetermined value. Then, the white-balance-adjusted signals are output to the gamma correction circuit 13a. For detailed descriptions of the operations of the gamma correction circuit 13a and succeeding circuits, refer to the second embodiment; they are omitted because the operations are similar to those of the second embodiment.

Since the white balance circuit and succeeding circuits can be shared as described above, the circuit scale can be made smaller than that of the solid-state image sensing apparatus according to the second embodiment, and an existing signal processing circuit that handles linearly converted electric signals can be applied to the signal processing circuit constituted by the white balance circuit and succeeding circuits.

Fourth Embodiment

Figure 10:
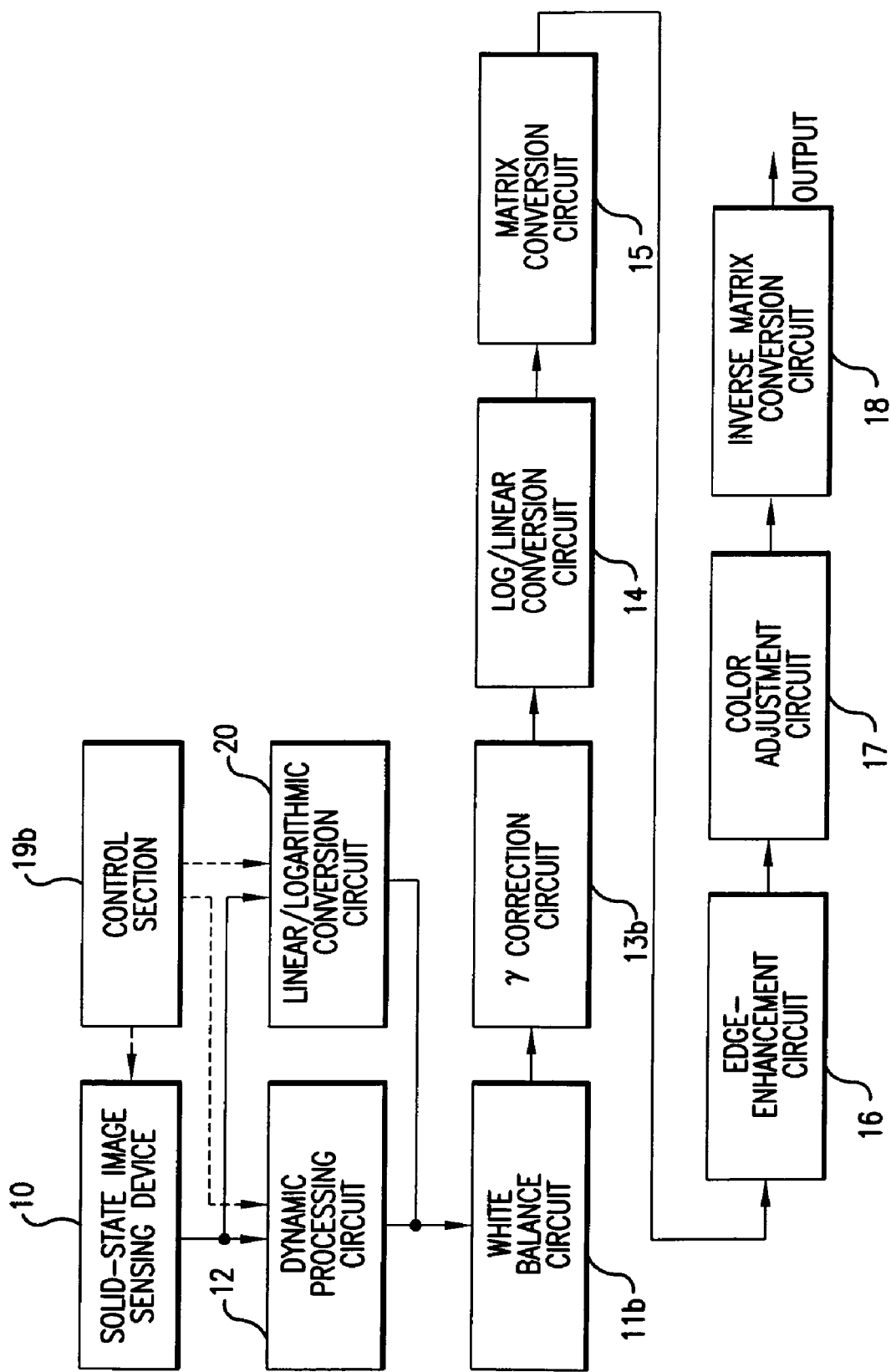
FIG. 10 is a block diagram showing the internal structure of the solid-state image sensing apparatus according to the fourth embodiment.

A fourth embodiment of the present invention will be described with reference to FIG. 10. FIG. 10 is a block diagram showing the internal structure of a solid-state image sensing apparatus according to this embodiment. In the solid-state image sensing apparatus according to this embodiment, elements used for the same purposes as those of the solid-state image sensing apparatus shown in FIG. 7 are designated by the same reference numbers, and descriptions thereof are omitted.

In the solid-state image sensing device of FIG. 10, the white balance circuit 11a and the gamma correction circuit 13a of the solid-state image sensing apparatus according to the first embodiment (FIG. 7) are deleted. Instead, a linear/logarithmic conversion circuit 20 is provided, and the output from the solid-state image sensing device 10 is sent to the white balance circuit 11b by way of the dynamic processing circuit 12 or the linear/logarithmic conversion circuit 20. Moreover, a control portion 19b controls turning on and off of the dynamic processing circuit 12 and the linear/logarithmic conversion circuit 20. Otherwise, the structure is similar to that of the solid-state image sensing apparatus according to the first embodiment.

In such a structure, when the solid-state image sensing device 10 is controlled so as to perform linear conversion by the control portion 19b, similar to the third embodiment (FIG. 9), the control portion 19b turns on the linear/logarithmic conversion circuit 20 and turns off the dynamic processing circuit 12. Consequently, the R, G and B signals obtained by the solid-state image sensing device 10 performing linear conversion are converted to signals of levels natural-logarithmically proportional to the intensity of the incident light at the linear/logarithmic conversion circuit 20, and are then sent to the white balance circuit 11b.

When the solid-state image sensing device 10 is controlled so as to perform logarithmic conversion by the control portion 19b, the control portion 19b turns off the linear/logarithmic conversion circuit 20 and turns on the dynamic processing circuit 12. Consequently, the R, G and B signals obtained by the solid-state image sensing device 10 performing logarithmic conversion are converted to signals of levels adjusted to the dynamic range of the output side at the dynamic processing circuit 12, and are then sent to the white balance circuit 11b.

As described above, the R, G and B signals obtained by the solid-state image sensing device 10 performing linear conversion pass through the linear/logarithmic conversion circuit 20. Alternatively, the R, G and B signals obtained by the solid-state image sensing device 10 performing logarithmic conversion pass through the dynamic processing circuit 12 The signals are sent to the white balance circuit 11b as signals natural-logarithmically proportional to the intensity of the incident light. At the white balance circuit 11b, like in the first embodiment, white balance adjustment is performed on the input R, G and B signals by adding a predetermined offset value to the levels of the input R, G and B signals.

When the R, G and B signals thus white-balance-adjusted are supplied to the gamma correction circuit 13b, at the gamma correction circuit 13b, gamma correction is performed by multiplying the input signals by a predetermined value. Then, the white-balance-adjusted and gamma-corrected R, G and B signals are converted to signals of levels linearly proportional to the intensity of the incident light at the logarithmic/linear conversion circuit 14, and are sent to the matrix conversion circuit 15. For detailed descriptions of the operations of the matrix conversion circuit 15 and succeeding circuits, refer to the first embodiment; they are omitted because the operations are similar to those of the first embodiment.

Since the white balance circuit and succeeding circuits can be shared as described above, the circuit scale can be made smaller than those of the solid-state image sensing apparatuses according to the first and the second embodiments. Moreover, since the white balance circuit is for logarithmically converted signals, an adder/subtractor circuit, rather than a multiplier/divider circuit, can be used. In this regard, the structure of the white balance circuit can be made simpler than that of the third embodiment. Further, since the gamma correction circuit is for logarithmically converted signals, no LUT is necessary, unlike, the gamma correction circuits for linearly converted signals, so that the structure of the gamma correction circuit can be made simpler than that of the third embodiment.

While the matrix conversion circuit, the edge enhancement circuit, the color adjustment circuit and the inverse matrix conversion circuit are for processing linearly converted electric signals in the first to the fourth embodiments, they may also process logarithmically converted electric signals.

FIGS. 11 to 14 show the internal structures of solid-state image sensing apparatuses according to fifth to eighth embodiments, corresponding to the solid-state image sensing apparatuses according to the first to the fourth embodiments (FIGS. 7 to 10), in which the matrix conversion circuit, the edge enhancement circuit, the color adjustment circuit and the inverse matrix conversion circuit are ones for processing logarithmically converted electric signals.

Figure 11:
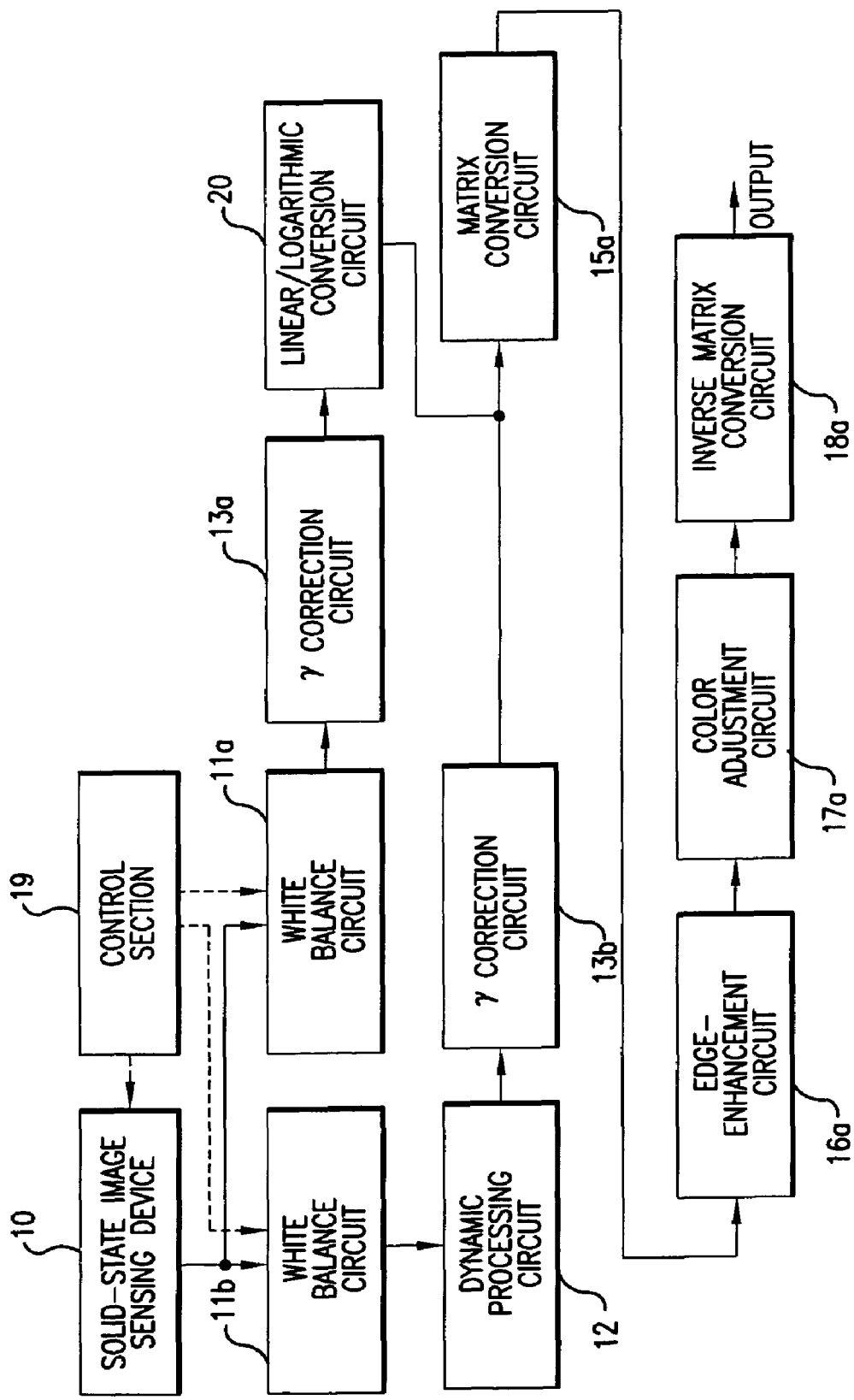
FIG. 11 is a block diagram showing the internal structure of the solid-state image sensing apparatus according to the fifth embodiment.

In the solid-state image sensing apparatus according to the fifth embodiment shown in FIG. 11, when compared to the solid-state image sensing apparatus according to the first embodiment (FIG. 7), the logarithmic/linear conversion circuit 14 succeeding the gamma correction circuit 13b is omitted. Instead, the linear/logarithmic conversion circuit 20 is provided in the rear of the gamma correction circuit 13a. Further, instead of the matrix conversion circuit 15, the edge enhancement circuit 16, the color adjustment circuit 17 and the inverse matrix conversion circuit 18, a matrix conversion circuit 15a, an edge enhancement circuit 16a, a color adjustment circuit 17a and an inverse matrix conversion circuit 18a that handle logarithmically converted electric signals are provided.

The solid-state image sensing apparatus performs similar operations to the solid-state image sensing apparatus according to the first embodiment, except that the output from the gamma correction circuit 13b is sent to the matrix conversion circuit 15a without being converted. Alternatively, the output from the gamma correction circuit 13a is sent to the matrix conversion circuit 15a after being converted to signals natural-logarithmically proportional to the intensity of the incident light at the linear/logarithmic conversion circuit 20 and that the matrix conversion circuit 15a, the edge enhancement circuit 16a, the color adjustment circuit 17a and the inverse matrix conversion circuit 18a handle logarithmically converted electric signals.

Figure 12:
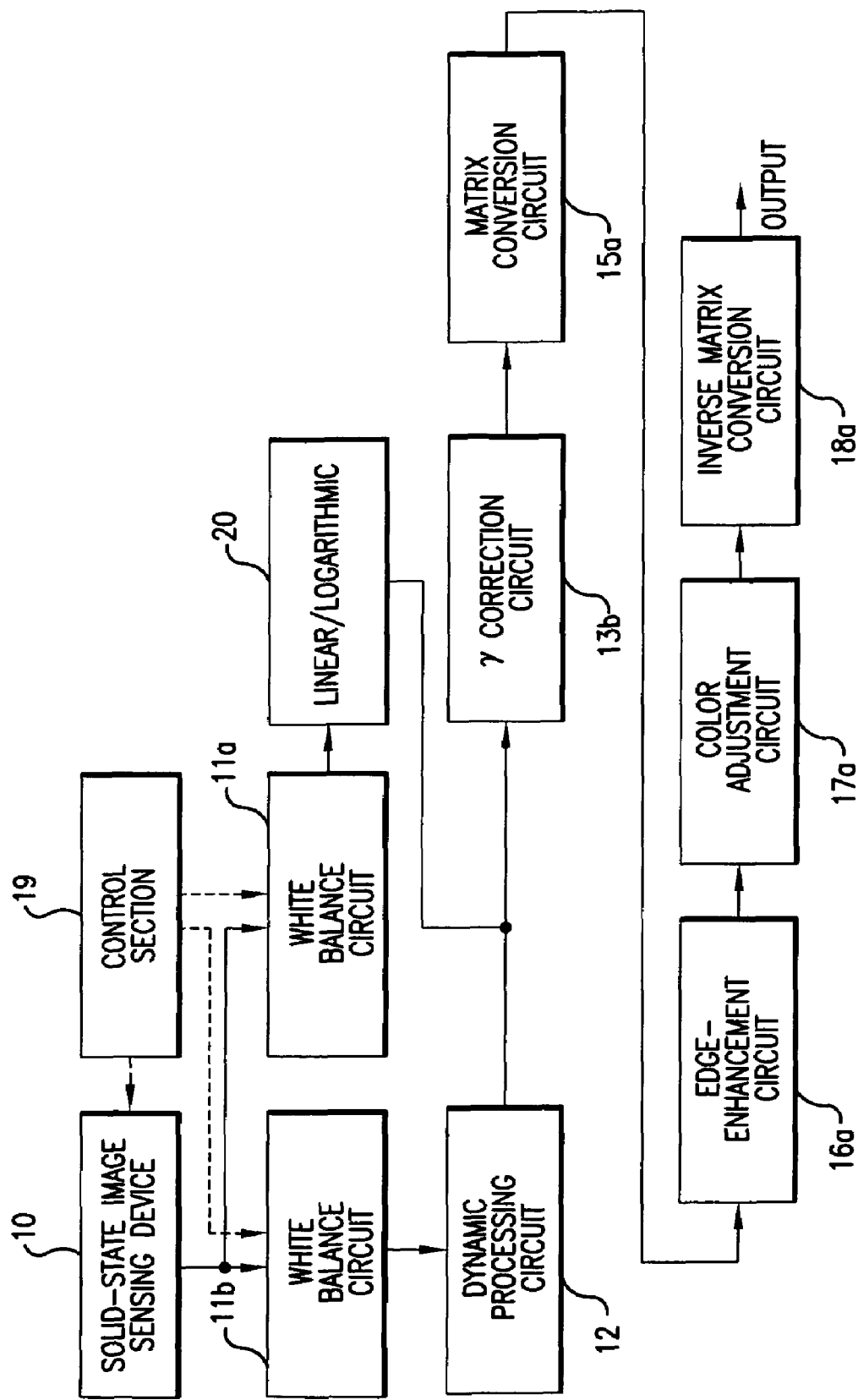
FIG. 12 is a block diagram showing the internal structure of the solid-state image sensing apparatus according to the sixth embodiment.

In the solid-state image sensing apparatus according to the sixth embodiment shown in FIG. 12, when compared to the solid-state image sensing apparatus according to the second embodiment (FIG. 8), the logarithmic/linear conversion circuit 14 succeeding the dynamic processing circuit 12 is omitted, Instead, the linear/logarithmic conversion circuit 20 is provided in the rear of the white balance circuit 11a. Further, instead of the gamma correction circuit 13a, the matrix conversion circuit 15, the edge enhancement circuit 16, the color adjustment circuit 17 and the inverse matrix conversion circuit 18, the gamma correction circuit 13b, the matrix conversion circuit 15a, the edge enhancement circuit 16a, the color adjustment circuit 17a and the inverse matrix conversion circuit 18a that handle logarithmically converted electric signals are provided.

The solid-state image sensing apparatus performs similar operations to the solid-state image sensing apparatus according to the second embodiment, except that the output from the dynamic processing circuit 12 is sent to the gamma correction circuit 13b without being converted. Alternatively, the output from the white balance circuit 11a is sent to the gamma correction circuit 13b after being converted to signals natural-logarithmically proportional to the intensity of the incident light at the linear/logarithmic conversion circuit 20 and that the gamma correction circuit 13b, the matrix conversion circuit 15a, the edge enhancement circuit 16a, the color adjustment circuit 17a and the inverse matrix conversion circuit 18a handle logarithmically converted electric signals.

Figure 13:
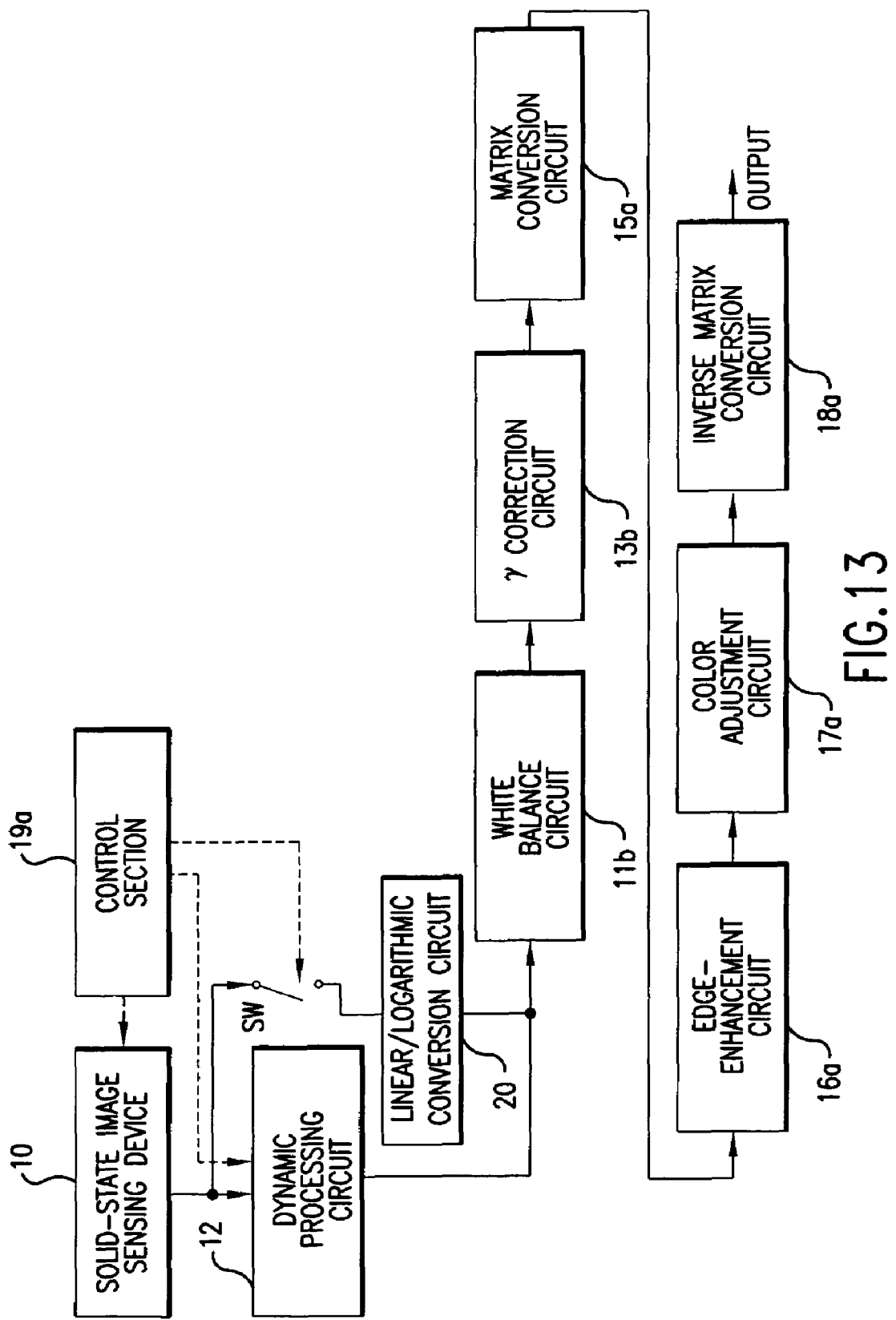
FIG. 13 is a block diagram showing the internal structure of the solid-state image sensing apparatus according to the seventh embodiment.

In the solid-state image sensing apparatus according to the seventh embodiment shown in FIG. 13, when compared to the solid-state image sensing apparatus according to the third embodiment (FIG. 9), the logarithmic/linear conversion circuit 14 succeeding the dynamic processing circuit 12 is omitted. Instead, the linear/logarithmic conversion circuit 20 is provided in the rear of the switch SW. Further, instead of the white balance circuit 11a, the gamma correction circuit 13a, the matrix conversion circuit 15, the edge enhancement circuit 16, the color adjustment circuit 17 and the inverse matrix conversion circuit 18, the white balance circuit 11b, the gamma correction circuit 13b, the matrix conversion circuit 15a, the edge enhancement circuit 16a, the color adjustment circuit 17a and the inverse matrix conversion circuit 18a that handle logarithmically converted electric signals are provided.

The solid-state image sensing apparatus performs similar operations to the solid-state image sensing apparatus according to the third embodiment, except that the output from the dynamic processing circuit 12 is sent to the white balance circuit 11b without being converted Alternatively, the output from the switch SW is sent to the white balance circuit 11b after being converted to signals natural-logarithmically proportional to the intensity of the incident light at the linear/logarithmic conversion circuit 20 and that the white balance circuit 11b, the gamma correction circuit 13b, the matrix conversion circuit 15a, the edge enhancement circuit 16a, the color adjustment circuit 17a and the inverse matrix conversion circuit 18a handle logarithmically converted electric signals.

Figure 14:
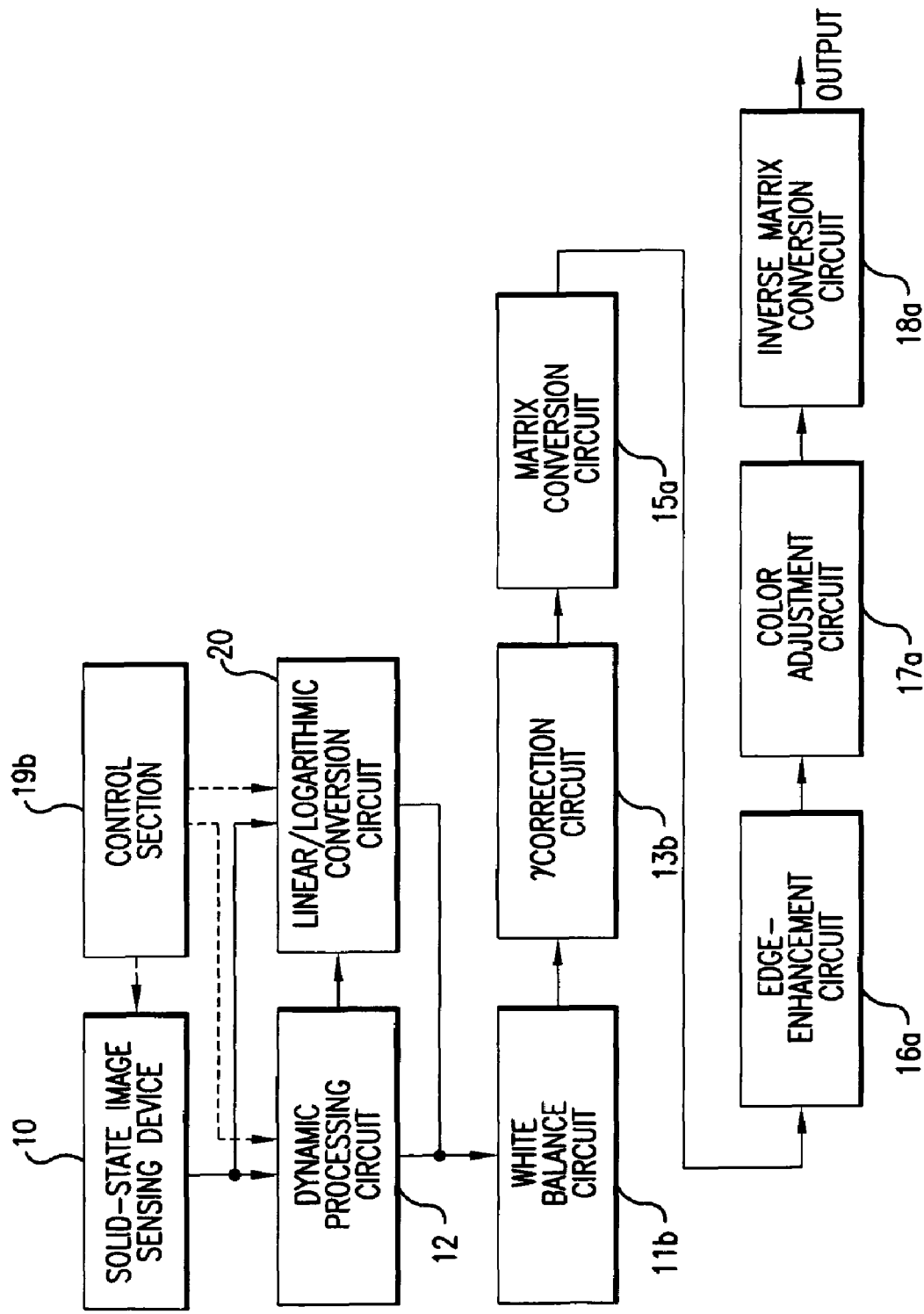
FIG. 14 is a block diagram showing the internal structure of the solid-state image sensing apparatus according to the eighth embodiment.

In the solid-state image sensing apparatus according to the eighth embodiment shown in FIG. 14, when compared to the solid-state image sensing apparatus according to the fourth embodiment (FIG. 10), the logarithmic/linear conversion circuit 14 succeeding the gamma correction circuit 13b is omitted. Further, instead of the matrix conversion circuit 15, the edge enhancement circuit 16, the color adjustment circuit 17 and the inverse matrix conversion circuit 18, the matrix conversion circuit 15a, the edge enhancement circuit 16a, the color adjustment circuit 17a and the inverse matrix conversion circuit 18a that handle logarithmically converted electric signals are provided.

The solid-state image sensing apparatus performs similar operations to the solid-state image sensing apparatus according to the fourth embodiment, except that the output from the gamma correction circuit 13b is sent to the matrix conversion circuit 15a without converted and that the matrix conversion circuit 15a, the edge enhancement circuit 16a, the color adjustment circuit 17a and the inverse matrix conversion circuit 18a handle logarithmically converted electric signals.

While in the first to the eighth embodiments, the solid-state image sensing device provided in the solid-state image sensing apparatus has pixels switchable between linear conversion and logarithmic conversion, it may have two kinds of pixels, one performing linear conversion and the other performing logarithmic conversion.

According to the solid-state image sensing apparatus of the present invention, since a circuit that processes the first signal converted linearly to the intensity of the incident light and a circuit that processes the second signal converted natural-logarithmically to the intensity of the incident light are provided, processing of signals from a solid-state image sensing apparatus that outputs the first signal or the second signal according to the circumstances can be performed for both of the signals.

Moreover, since the first signal and the second signal are independently processed and then, the second signal thus processed is converted to a signal of a level linearly proportional to the intensity of the incident light, the succeeding signal processing circuit can be shared. Consequently, the circuit scale of the solid-state image sensing apparatus can be reduced.

Moreover, since the first signal and the second signal are independently processed, (the first signal processed is then converted to a signal of a level natural-logarithmically proportional to the intensity of the incident light) the succeeding signal processing circuit can be shared. Consequently, the circuit scale of the solid-state image sensing apparatus can be reduced. Further, in this structure, when gamma correction is performed by a common circuit, since it can be performed by multiplying the input signals by a predetermined value γ, an LUT serving as a reference table is unnecessary unlike the case where signals of levels linearly proportional to the intensity of the incident light is gamma-corrected, so that the scale of the circuit for gamma correction can be reduced.

What is claimed is:

1. A solid-state image sensing apparatus, comprising:
    a solid-state image sensing device outputting an electrical signal proportional to an intensity of incident light, the solid-state image sensing device configured for outputting a first signal converted linearly to the intensity of the incident light and a second signal converted natural-logarithmically to the intensity of the incident light, wherein a dynamic range of the second signal is adjusted to improve a contrast of the second signal and increase a compressed range of a luminance distribution of an imaged subject by natural-logarithmically conversion;
    a logarithmic/linear conversion circuit converting the second signal to a signal linearly proportional to the intensity of the incident light;
    a signal processing circuit supplied with the first signal and a signal from the logarithmic/linear conversion circuit, said signal processing circuit configured to perform white balance adjustment of the first signal or the signal from the logarithmic/linear conversion circuit to produce a linear signal; and
    a second signal processing circuit supplied with the linear signal from the signal processing circuit, the second signal processing circuit configured to perform matrix conversion, edge enhancement, color adjustment or inverse matrix conversion on the linear signal.

2. The solid-state image sensing apparatus as claimed in claim 1, wherein a plurality of color filters are provided in the solid-state image sensing device, and the first signal and the second signal output from the solid-state image sensing apparatus each comprise a plurality of color signals.

3. The solid-state image sensing apparatus as claimed in claim 1, wherein the signal processing circuit performs gamma correction of the supplied signals.

4. A solid-state image sensing apparatus having a solid-state image sensing device that outputs an electrical signal proportional to an intensity of incident light, the solid-state image sensing device configured for outputting a first signal converted linearly to the intensity of the incident light and a second signal converted natural-logarithmically to the intensity of the incident light, comprising:
    a first signal processing circuit supplied with the second signal from the solid-state image sensing apparatus and adjusting a dynamic range of the second signal to improve a contrast of the second signal and increase a compressed range of a luminance distribution of an imaged subject by natural-logarithmically conversion;
    a linear/logarithmic conversion circuit converting the first signal to a signal natural- logarithmically proportional to the intensity of the incident light; and
    a second signal processing circuit supplied with a signal from the first signal processing circuit and a signal from the linear/logarithmic conversion circuit, said second signal processing circuit configured to perform white balance adjustment of the signal from the first signal processing circuit or the signal from the linear/logarithmic conversion circuit to produce a logarithmic signal; and
    a third signal processing circuit supplied with the logarithmic signal from the second signal processing circuit, the third signal processing circuit configured to perform logarithmic/linear conversion, matrix conversion, edge enhancement, color adjustment or inverse matrix conversion to produce a linear signal.

5. The solid-state image sensing apparatus as claimed in claim 4, wherein a plurality of color filters are provided in the solid-state image sensing device, and the first signal and the second signal output from the solid-state image sensing apparatus each comprise a plurality of color signals.

6. The solid-state image sensing apparatus as claimed in claim 4, wherein the second signal processing circuit performs gamma correction of the supplied signals.

7. A solid-state image sensing apparatus having a solid-state image sensing device that outputs an electrical signal proportional to an intensity of incident light, the solid-state image sensing device configured outputting a first signal converted linearly to the intensity of the incident light and a second signal converted natural-logarithmically to the intensity of the incident light, comprising:
    a first signal processing circuit supplied with the first signal from the solid-state image sensing apparatus and performing a white balance adjustment of the first signal to produce a linear signal;
    a second signal processing circuit supplied with the second signal from the solid-state image sensing apparatus and performing a white balance adjustment of the second signal, wherein a dynamic range of the second signal is adjusted at the second signal processing circuit to improve a contrast of the second signal and increase a compressed range of a luminance distribution of the imaged subject by natural-logarithmically conversion;
    a linear/logarithmic conversion circuit converting the linear signal output from the first signal processing circuit to a signal natural-logarithmically proportional to the intensity of the incident light; and
    a third signal processing circuit supplied with a signal from the second signal processing circuit and a signal from the linear/logarithmic conversion circuit to perform matrix conversion, edge enhancement, color adjustment or inverse matrix conversion to produce a logarithmic signal.

8. A solid-state image sensing apparatus as claimed in claim 7, wherein
    a plurality of color filters are provided in the solid-state image sensing device, and the first signal and the second signal output from the solid-state image sensing apparatus each comprise a plurality of color signals.

9. The solid-state image sensing apparatus as claimed in claim 7, wherein the first signal processing circuit performs gamma correction of the first signal, and the second signal processing circuit performs gamma correction of the second signal.

* * * * *

UNITED STATES PATENT AND TRADEMARK OFFICE
CERTIFICATE OF CORRECTION

| | |
|---|---|
| PATENT NO. | : 7,609,299 B2 |
| APPLICATION NO. | : 11/411138 |
| DATED | : October 27, 2009 |
| INVENTOR(S) | : Satoshi Nakamura |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 629 days.

Signed and Sealed this

Twelfth Day of October, 2010

David J. Kappos
*Director of the United States Patent and Trademark Office*